US012166108B2

United States Patent
Hung et al.

(10) Patent No.: US 12,166,108 B2
(45) Date of Patent: Dec. 10, 2024

(54) STRAINED TRANSISTOR WITH CONDUCTIVE PLATE

(71) Applicant: Taiwan Semiconductor Manufacturing Co., Ltd., Hsinchu (TW)

(72) Inventors: Chan-Yu Hung, Tainan (TW); Chia-Cheng Ho, Hsinchu (TW); Fei-Yun Chen, Hsinchu (TW); Yu-Chang Jong, Hsinchu (TW); Puo-Yu Chiang, Hsinchu (TW); Tun-Yi Ho, Keelung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 96 days.

(21) Appl. No.: 17/747,104

(22) Filed: May 18, 2022

(65) Prior Publication Data

US 2023/0378324 A1  Nov. 23, 2023

(51) Int. Cl.
*H01L 29/66* (2006.01)
*H01L 29/40* (2006.01)
*H01L 29/78* (2006.01)

(52) U.S. Cl.
CPC ...... *H01L 29/66689* (2013.01); *H01L 29/402* (2013.01); *H01L 29/7824* (2013.01)

(58) Field of Classification Search
CPC ............. H01L 29/66689; H01L 29/402; H01L 29/7824
See application file for complete search history.

(56) References Cited

U.S. PATENT DOCUMENTS

| 2013/0020632 A1* | 1/2013 | Disney | H01L 29/0847 257/E21.409 |
| 2016/0149007 A1* | 5/2016 | Chou | H01L 29/407 257/339 |

FOREIGN PATENT DOCUMENTS

TW  202121632 A  6/2021

OTHER PUBLICATIONS

Office Action, dated Oct. 5, 2023, Taiwan Intellectual Property Office Appl. No. 112101692, 7 pages.

* cited by examiner

*Primary Examiner* — Mohammed R Alam
(74) *Attorney, Agent, or Firm* — Sterne, Kessler, Goldstein & Fox P.L.L.C.

(57) ABSTRACT

The present disclosure describes a structure with a conductive plate and a method for forming the structure. The structure includes a gate structure disposed on a diffusion region of a substrate, a protective layer in contact with the diffusion region and covering a sidewall of the gate structure and a portion of a top surface of the gate structure, and a first insulating layer in contact with the gate structure and the protective layer. The structure further includes a conductive plate in contact with the first insulating layer, where a first portion of the conductive plate laterally extends over a horizontal portion of the protective layer, and where a second portion of the conductive plate extends over a sidewall portion of the protective layer covering the sidewall of the gate structure. The structure further includes a second insulating layer in contact with the conductive plate.

20 Claims, 31 Drawing Sheets

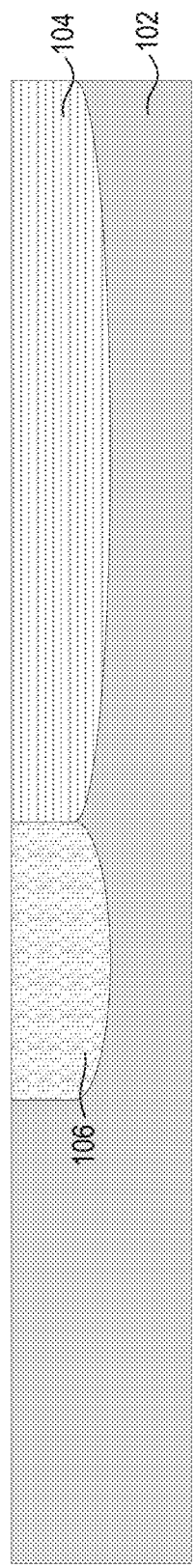
FIG. 5
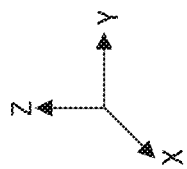

STRAINED TRANSISTOR WITH CONDUCTIVE PLATE

BACKGROUND

Laterally-diffused metal-oxide-semiconductor field-effect transistors (LDMOSFETs) are used in power management integrated circuits (PMICs), power amplifiers, and buck converters. These power devices can be used in wireless communications, smart home electronics, and automobile electronics. A high breakdown voltage and a low on-resistance are desired in LDMOSFETs.

BRIEF DESCRIPTION OF THE DRAWINGS

Aspects of the present disclosure are best understood from the following detailed description when read with the accompanying figures.

FIGS. 5-14, 15A-15C, 16A-16C, 17A-17C, 18A-18C, and 19A-19C illustrate cross-sectional views of strained transistors with a conductive plate at various stages of their fabrication process, in accordance with some embodiments.

DETAILED DESCRIPTION

Figure 1A:
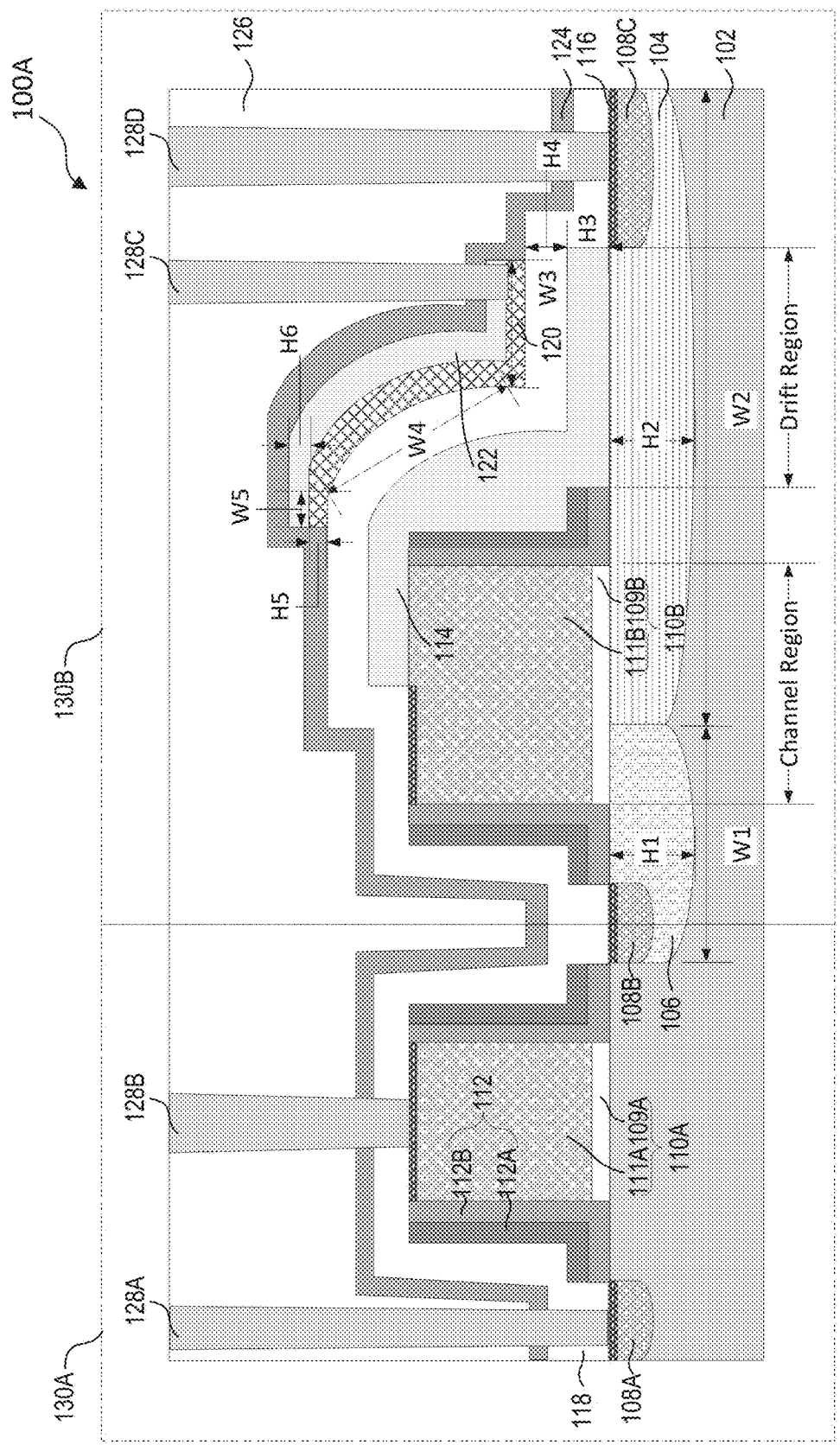
FIGS. 1A-1C illustrate cross-sectional views of strained transistors with a conductive plate, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The discussion of elements in FIGS. 1A-1C, 2, and 5-14, 15A-15C, 16A-16C, 17A-17C, 18A-18C, and 19A-19C with the same annotations applies to each other, unless mentioned otherwise.

Laterally-diffused metal-oxide-semiconductor field-effect transistors (LDMOSFETs) are used in power management integrated circuits (PMICs), power amplifiers, and buck converters. These power devices can be used in wireless communications, smart home electronics, and automobile electronics. A high breakdown voltage is desired in LDMOSFETs to meet high power/voltage level demands in these electronic devices. Placing a metal field plate on an interlayer dielectric (ILD) layer above a diffusion region of the LDMOSFETs can result in a reduced surface field (RESURF) between the metal field plate and the diffusion region. The RESURF electric field can generate a depletion region in the diffusion region, which can increase the breakdown voltage. However, the ILD layer thickness increases the distance between the metal field plate and the diffusion region, which decreases the RESURF electric field strength. Therefore, the effect of the metal field plate in increasing the breakdown voltage is reduced by the ILD layer. A low on-resistance is also desired in LDMOSFETs to reduce power loss and improve power conversion efficiency. The on-resistance is associated with both the channel region resistance and the drift region resistance. As the semiconductor industry scales down the sizes of LDMOSFETs, the areas of the channel region and the drift region decrease, which increases the channel region resistance and the drift region resistance. The increased on-resistance can cause higher power loss and lower power conversion efficiency.

The present disclosure provides example strained LDMOSFETs with an integrated conductive plate and an example method for fabricating the same. A first diffusion region and a second diffusion region, longer than the first diffusion region, can be implanted in a substrate. Source/drain (S/D) regions can be implanted in the substrate. Gate structures and spacers can be formed on the substrate. Silicide layers can be formed on the S/D regions and portions of the gate structures. A protective layer can be formed on the second diffusion region and over a portion of the gate structures. A first insulating layer can be formed on the protective layer, on the S/D regions, on the silicide layers, over the gate structures, and over the spacers. A conductive plate can be formed on the first insulating layer. A first portion of the conductive plate can laterally extend over a horizontal portion of the protective layer. A second portion of the conductive plate can extend over a sidewall portion of the protective layer covering the sidewall of the gate structures. A third portion of the conductive plate can laterally extend over another horizontal portion of the protective layer above the top surface of the gate structures. A second insulating layer can be formed on the conductive plate. A first end of the second insulating layer can be substantially aligned with a first end of the conductive plate. A second end of the second insulating layer can be substantially aligned with a second end of the conductive plate. An etch stop layer (ESL) can be formed on the first and second insulating layers. An ILD layer can be formed on the ESL. Contact structures can be formed within the ILD layer.

The conductive plate can cause a RESURF electric field between the conductive plate and the second diffusion region. The RESURF electric field can generate a depletion region in the second diffusion region, which can increase the breakdown voltage of the LDMOSFETs. Because the conductive plate is below the ILD layer, the effect of the conductive plate in increasing the breakdown voltage is not affected by the ILD layer thickness. The conductive plate is separated from the second diffusion region by a distance controlled by the thicknesses of the protective layer and the first insulating layer. Compared with the ILD layer thickness, this distance is smaller, for example, between about 30 nm and about 100 nm in some embodiments. Therefore, the RESURF electric field strength can be increased and the effect of the conductive plate in increasing the breakdown voltage can be greater. The conductive plate can increase the breakdown voltage to meet a higher power/voltage level demand of the high-voltage power devices. The RESURF electric field strength and the breakdown voltage can be controlled by changing the thicknesses of the protective layer and the first insulating layer.

The conductive plate can also cause a compressive strain/stress in the drift region of the LDMOSFETs, and a compressive and/or a tensile strain/stress in the channel region of the LDMOSFETs. For example, in some embodiments, the conductive plate can cause between about 0.1 GPa and about 3 GPa compressive and/or tensile stress in the drift region and the channel region. The strains and the stresses in the drift region and the channel region can increase carrier mobility, such as electron mobility and hole mobility. The increased carrier mobility can decrease the channel region resistance and the drift region resistance, which can contribute to a decreased on-resistance. The decreased on-resistance can reduce power loss and improve power conversion efficiency. Furthermore, the conductive plate that increases the breakdown voltage and reduces the on-resistance can be integrated into the fabrication of the LDMOSFETs. This integration can reduce the fabrication complexity, cycle time of fabricating high-voltage transistors, and cost.

Figure 1B:
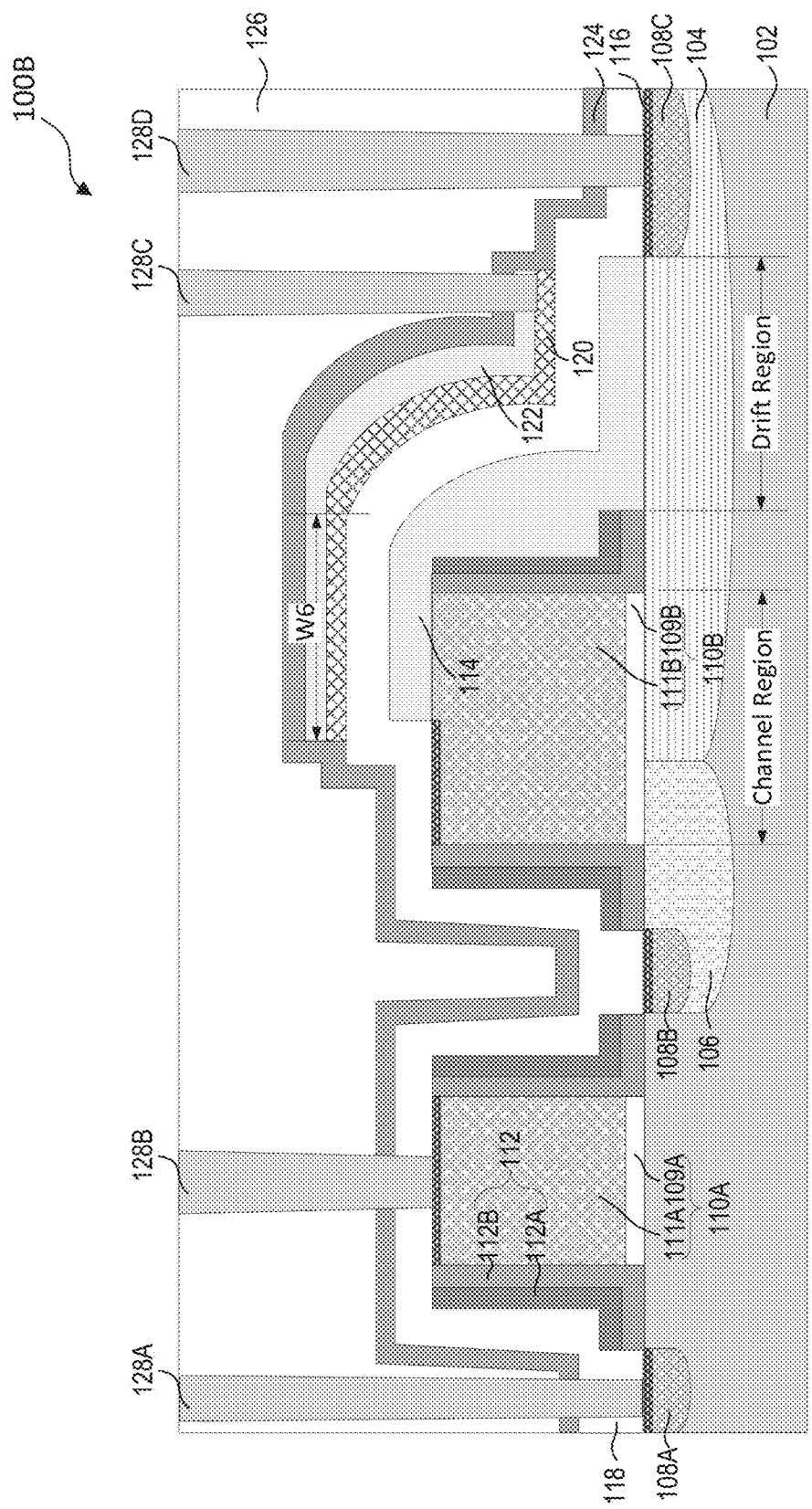
Figure 1C:
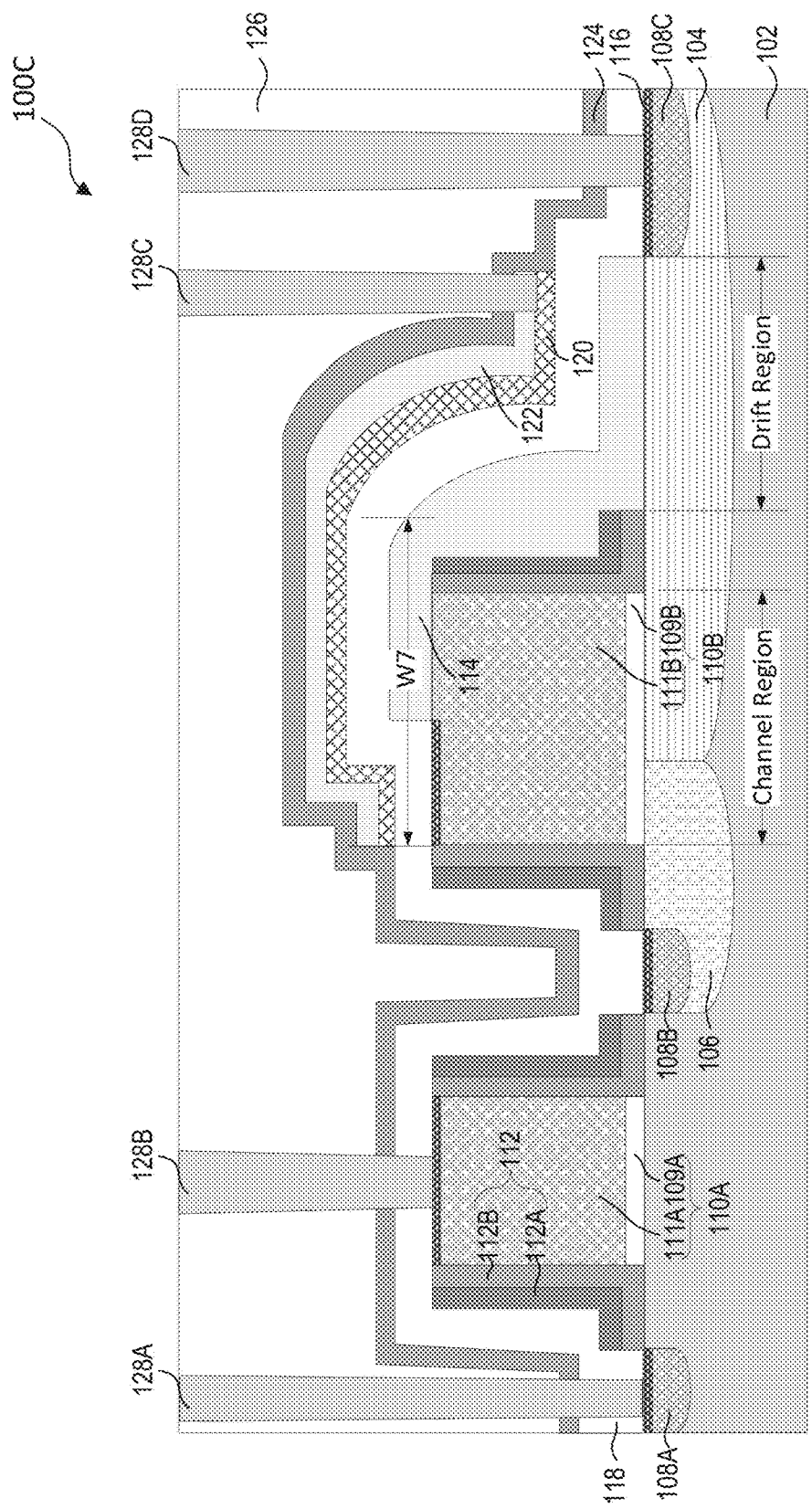

FIGS. 1A-1C illustrate cross-sectional views of strained transistors 100A-100C, according to some embodiments. Strained transistors 100A-100C vary in the sizes of their conductive plates 120 and their second insulating layers 122. Each strained transistor of strained transistors 100A-100C can include a substrate 102, a first diffusion region 106, a second diffusion region 104, S/D regions 108A-108C, silicide layers 116, gate structures 110A (including a gate dielectric layer 109A and a gate electrode 111A) and 110B (including a gate dielectric layer 109B and a gate electrode 111A), spacers 112 (including a first spacer layer 112A and a second spacer layer 112B), a protective layer 114, a first insulating layer 118, a conductive plate 120, a second insulating layer 122, an ESL 124, an ILD layer 126, S/D contact structures 128A and 128D, gate contact structures 128B, and conductive plate contact structures 128C. In some embodiments, each strained transistor of strained transistors 100A-100C can include a low-voltage transistor 130A and a high-voltage transistor 130B.

Substrate 102 can be a semiconductor material, such as silicon (Si), germanium (Ge), silicon germanium (SiGe), a silicon-on-insulator (SOI) structure, and combinations thereof. Further, substrate 102 can be doped with p-type dopants, such as boron (B), indium (In), aluminum (Al), and gallium (Ga), or n-type dopants, such as phosphorous (P) and arsenic (As).

First and second diffusion regions 106 and 104 can be doped regions disposed in substrate 102. First and second diffusion regions 106 and 104 can include a semiconductor material, such as Si and SiGe. First and second diffusion regions 106 and 104 can be doped with p-type dopants, such as B and other suitable p-type dopants. First and second diffusion regions 106 and 104 can be doped with n-type dopants, such as P and other suitable n-type dopants. In some embodiments, first and second diffusion regions 106 and 104 can be doped with opposite types of dopants. For example, first diffusion region 106 can be doped with p-type dopants and second diffusion region 104 can be doped with n-type dopants. A dopant concentration of first and second diffusion regions 106 and 104 can be in a range from about $1 \times 10^{20}$ atoms/cm$^3$ to about $3 \times 10^{22}$ atoms/cm$^3$. First diffusion region 106 can have a depth H1 and second diffusion region 104 can have a depth H2, and depths H1 and H2 can be between about 50 nm and about 150 nm. First diffusion region 106 can have a width W1 between about 50 nm and about 10 μm. Second diffusion region 104 can have a width W2 between about 100 nm and about 30 μm. A ratio W2/W1 can be between about 4 and about 6, between about 3 and about 8, and between about 2 and about 10. If the ratio W2/W1 is less than about 2, the depletion region generated by the RESURF electric field in second diffusion region 104 can be too short and the breakdown voltage can be too small for a high-voltage application. If the ratio W2/W1 is greater than about 10, the size of high-voltage transistor 130B can be too great.

S/D regions 108A-108C can be doped regions disposed in substrate 102 and first and second diffusion regions 106 and 104. S/D regions 108A-108C can include a semiconductor material, such as Si and SiGe. S/D regions 108A-108C can be doped with p-type dopants, such as B and other suitable p-type dopants. S/D regions 108A-108C can be doped with n-type dopants, such as P and other suitable n-type dopants. In some embodiments, S/D regions 108A-108C can be doped with the same dopant as second diffusion region 104 and with the opposite dopant as first diffusion region 106. For example, S/D regions 108A-108C and second diffusion region 104 can be doped with n-type dopants and first diffusion region 106 can be doped with p-type dopants. A dopant concentration of S/D regions 108A-108C can be in a range from about $1 \times 10^{20}$ atoms/cm$^3$ to about $3 \times 10^{22}$ atoms/cm$^3$. In some embodiments, S/D regions 108A-108C can have a higher dopant concentration than that of first and second diffusion regions 106 and 104. For example, S/D regions 108A-108C can have a dopant concentration that is between about 10 times and about 100 times higher than that of first and second diffusion regions 106 and 104.

Silicide layers 116 can be disposed on S/D regions 108A-108C and portions of gate electrodes 111A and 111B. In some embodiments, silicide layers 116 can be disposed in a top portion of S/D regions 108A-108C and gate electrodes 111A and 111B. Silicide layers 116 can include a metal silicide material. Silicide layers 116 can include the same semiconductor material as that of S/D regions 108A-108C and gate electrodes 111A and 111B. Silicide layers 116 can include the same dopants used to dope S/D regions 108A-108C. Silicide layers 116 can further include a metal, such as titanium (Ti).

Gate structures 110A and 110B can be planar gate structures, fin field-effect transistors (finFETs), or gate-all-around field-effect transistors (GAAFETs). In some embodiments, gate structures 110A and 110B can include an interfacial oxide (IO) layer (not shown in FIGS. 1A-1C). Gate structures 110A and 110B can include gate dielectric layers 109A and 109B. In some embodiments, gate dielectric layers 109A and 109B can include an insulating material, such as silicon oxide ($SiO_x$), silicon nitride (SiN), silicon carbon nitride (SiCN), silicon oxycarbon nitride (SiOCN), germanium oxide ($GeO_x$), and silicon germanium oxide ($SiGeO_x$). In some embodiments, gate dielectric layers 109A and 109B can include a high-k (HK) dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). Gate dielectric layers 109A and 109B can have a thickness between about 1 nm and about 10 nm.

Gate structures 110A and 110B can include gate electrodes 111A and 111B. In some embodiments, gate electrodes 111A and 111B can include a polysilicon material disposed on gate dielectric layers 109A and 109B. In some embodiments, gate electrodes 111A and 111B can include a conductive layer disposed on gate dielectric layers 109A and 109B. The conductive layer can have multiple layers (not shown in FIGS. 1A-1C). The conductive layer can include a work function metal (WFM) layer (not shown in FIGS. 1A-1C) disposed on gate dielectric layers 109A and 109B and a metal fill layer (not shown in FIGS. 1A-1C) disposed on the WFM layer. In some embodiments, the WFM layer can include titanium aluminum (TiAl), titanium aluminum carbide (TiAlC), tantalum aluminum (TaAl), tantalum aluminum carbide (TaAlC), Al-doped Ti, Al-doped titanium nitride (TiN), Al-doped tantalum (Ta), Al-doped tantalum nitride (TaN), other suitable Al-based materials, substantially Al-free (e.g., with no Al) Ti-based or Ta-based nitrides or alloys, such as TiN, titanium silicon nitride (TiSiN), titanium gold (Ti—Au) alloy, titanium copper (Ti—Cu) alloy, TaN, tantalum silicon nitride (TaSiN), tantalum gold (Ta—Au) alloy, tantalum copper (Ta—Cu) alloy, and combinations thereof. The metal fill layer can include a suitable conductive material, such as tungsten (W), low-fluorine tungsten (LFW), Ti, silver (Ag), ruthenium (Ru), molybdenum (Mo), copper (Cu), cobalt (Co), Al, iridium (Ir), nickel (Ni), metal alloys, and combinations thereof. The metal fill layer can have a thickness between about 2 nm and about 100 nm.

Spacers 112, ESL 124, and ILD layer 126 can include an insulating material, such as $SiO_x$, SiN, SiCN, SiOCN, and $SiGeO_x$. Spacers 112 can include first and second spacer layers 112A and 112B. In some embodiments, first spacer layer 112A can be $SiO_x$ and second spacer layer 112B can be SiN.

Protective layer 114 can include an insulating material, such as $SiO_x$, SiN, SiCN, SiOCN, and $SiGeO_x$. A first portion of protective layer 114 can be disposed on second diffusion region 104 between gate structure 110B and S/D region 108C. In some embodiments, the first portion of protective layer 114 can be shorter than a distance between gate structure 110B and S/D region 108C. In some embodiments, the first portion of protective layer 114 can extend on or beyond S/D region 108C. A second portion of protective layer 114 can be disposed over a sidewall of gate structure 110B and spacer 112. In some embodiments, the second portion of protective layer 114 can have a curved sidewall covering the sidewall of gate structure 110B and spacer 112. A third portion of protective layer 114 can be disposed on a portion of a top surface of gate structure 110B and a top surface of spacer 112. In some embodiments, the third portion of protective layer 114 can cover an entire top surface of gate structure 110B. Without the third portion of protective layer 114, defects, such as voids, can be formed between gate structure 110B and protective layer 114. The third portion of protective layer 114 can reduce the formation of defects between gate structure 110B and protective layer 114. Protective layer 114 can have a thickness H3 between about 15 nm and about 50 nm.

First insulating layer 118 can include an insulating material, such as $SiO_x$, SiN, SiCN, SiOCN, and $SiGeO_x$. First insulating layer 118 can be disposed on S/D regions 108A-108C, silicide layers 116, protective layer 114, gate structures 110A and 110B, and spacers 112. In some embodiments, first insulating layer 118 can have a curved portion covering the curved sidewall of protective layer 114. First insulating layer 118 can have a thickness H4 between about 15 nm and about 50 nm. Total thickness H3+H4 can be between about 50 nm and about 60 nm, between about 40 nm and about 80 nm, and between about 30 nm and about 100 nm. If H3+H4 is less than about 30 nm, the electric field strength between conductive plate 120 and second diffusion region 104 can be greater than the breakdown field of Si, which is between about $3 \times 10^5$ V/cm and about $5 \times 10^5$ V/cm. Consequently, high-voltage transistor 130B can be damaged. If H3+H4 is greater than about 100 nm, the electric field strength between conductive plate 120 and second diffusion region 104 can be too small to generate a sufficient depletion region in second diffusion region 104. Breakdown voltage can be lower with a smaller depletion region. Consequently, the breakdown voltage of high-voltage transistor 130B can be insufficient to meet the power/voltage level demand of the high-voltage power devices.

Figure 3:
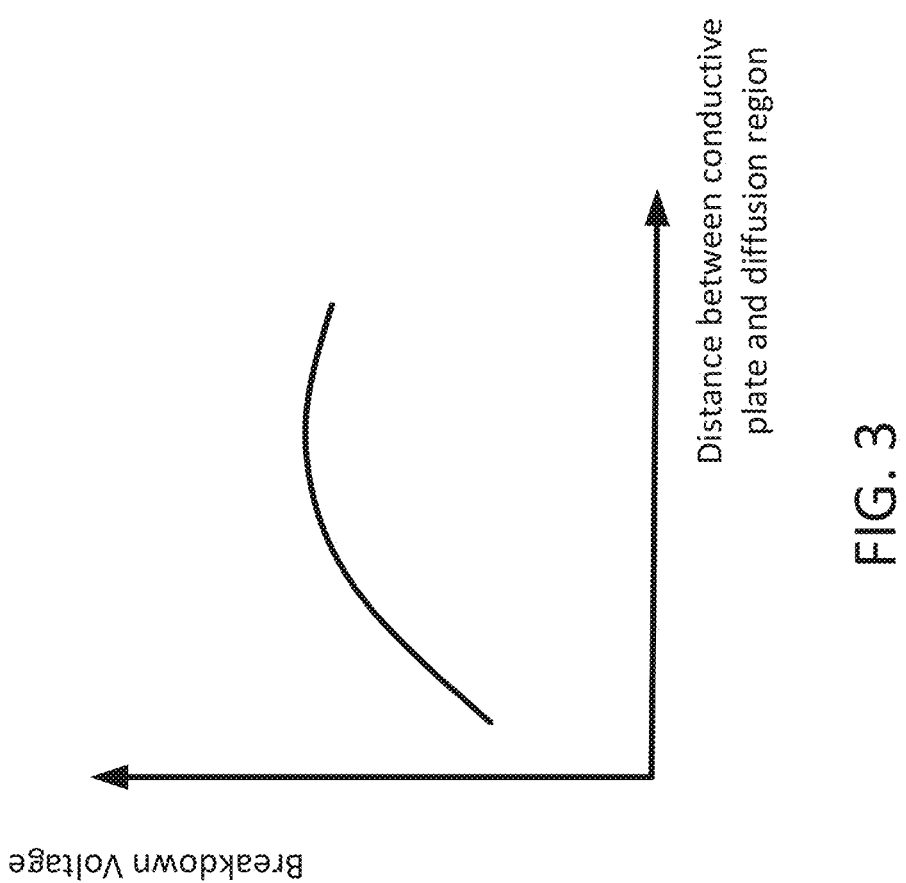
FIG. 3 is a plot of breakdown voltage with respect to distance between a conductive plate and a diffusion region, in accordance with some embodiments.

Referring to FIG. 3, the breakdown voltage of high-voltage transistor 130B can vary with respect to the distance between conductive plate 120 and second diffusion region 104. For example, the breakdown voltage of high-voltage transistor 130B can vary with respect to total thickness H3+H4. Within a range of about 30 nm to about 100 nm, as total thickness H3+H4 increases, conductive plate 120 can be farther away from second diffusion region 104. Even though the depth of the resulting depletion region in second diffusion region 104 can be decreasing, the area of the depletion region can be increasing. Cumulatively, the breakdown voltage increases. However, after total thickness H3+H4 reaches a certain thickness, the area increase of the depletion region cannot compensate for the depth decrease of the depletion region. The area increase of the depletion region also cannot compensate for the electric field strength decrease of the RESURF electric field between conductive plate 120 and second diffusion region 104. Consequently, breakdown voltage decreases. Total thickness H3+H4 has a big impact on controlling the breakdown voltage of high-voltage transistor 130B. By controlling the thicknesses of protective layer 114 and first insulating layer 118, the distance between conductive plate 120 and second diffusion region 104 can be controlled to obtain a certain breakdown voltage for a certain power/voltage level demand of the high-voltage power devices.

Referring to FIGS. 1A-1C, conductive plate 120 can include a metal, such as Ti, Ta, W, Co, Cu, and combinations thereof. In some embodiments, conductive plate 120 can include a metal nitride, such as TiN, TaN, and combinations thereof. Conductive plate 120 can be disposed on first insulating layer 118. A first portion of conductive plate 120 can laterally extend over a horizontal portion of protective layer 114. In some embodiments, a first end of conductive plate 120, such as the right end of conductive plate 120 as shown in FIGS. 1A-1C, can be substantially aligned with the right end of protective layer 114. A second portion of conductive plate 120 can extend over a sidewall portion of protective layer 114 covering the sidewall of gate structure 110B. A third portion of conductive plate 120 can laterally extend over another horizontal portion of protective layer 114 above the top surface of gate structure 110B. A second end of conductive plate 120, such as the left end of conductive plate 120 as shown in FIGS. 1A-1C, can be disposed at various locations. Referring to FIG. 1A, the left end of conductive plate 120 can be disposed above spacer 112 to the right of gate structure 110B. Referring to FIG. 1B, the left end of conductive plate 120 can be disposed above gate structure 110B. Referring to FIG. 1C, the left end of conductive plate 120 can be substantially aligned with the left end of gate structure 110B.

Referring to FIGS. 1A-1C, conductive plate 120 can have two functions. The first function of conductive plate 120 is to generate a RESURF electric field between conductive plate 120 and second diffusion region 104. The RESURF electric field can generate a depletion region in second diffusion region 104 and can increase the breakdown voltage of high-voltage transistor 130B. The second function of conductive plate 120 is to generate a compressive and/or tensile strain/stress in the channel region and the drift region. The channel region can be the regions of first and second diffusion regions 106 and 104 that are below gate structure 110B. The drift region can be second diffusion region 104 between gate structure 110B and S/D region 108C. The strain/stress in the channel region and the drift region can increase carrier mobility, such as electron mobility and hole mobility, and therefore reduce on-resistance. The reduced on-resistance can reduce power loss and improve power conversion efficiency.

Conductive plate 120 can have three portions. The first portion of conductive plate 120 can be substantially parallel to substrate 102. The first portion of conductive plate 120 can have a width W3 between about 200 nm and about 5 µm, between about 100 nm and about 8 µm, and between about 50 nm and about 10 µm. The second portion of conductive plate 120 can be over a sidewall of gate structure 110B and spacer 112. The second portion of conductive plate 120 can have a curved sidewall covering the curved portion of first insulating layer 118. The second portion of conductive plate 120 can be interposed between the first and third portions of conductive plate 120. The second portion of conductive plate 120 can have a width W4 between about 20 nm and about 0.5 µm, between about 15 nm and about 0.8 µm, and between about 10 nm and about 1 µm. If width W3 is less than about 50 nm or width W4 is less than about 10 nm, the area of the RESURF electric field between conductive plate 120 and second diffusion region 104 can be too small to generate a sufficient depletion region in second diffusion region 104. Breakdown voltage can be lower with a smaller depletion region. Consequently, the breakdown voltage of high-voltage transistor 130B can be insufficient to meet the power/voltage level demand of the high-voltage power devices. The first and second portions of conductive plate 120 can also generate a compressive strain/stress in the drift region and induce a tensile strain/stress in the channel region. If width W3 is less than about 50 nm or width W4 is less than about 10 nm, the compressive strain/stress in the drift region and the tensile strain/stress in the channel region can be too small. The carrier mobility increase can be too small to reduce resistance in the drift region and the channel region. If width W3 is greater than about 10 µm or width W4 is greater than about 1 µm, the size of high-voltage transistor 130B can be too great. The first and second portions of conductive plate 120 can also generate too much compressive strain/stress in the drift region and generate too many defects.

The third portion of conductive plate 120 can be substantially parallel to substrate 102. The third portion of conductive plate 120 can have various widths. The third portion of conductive plate 120 can generate various strain/stress conditions in the channel region based on the various widths. Referring to FIG. 1A, the third portion of conductive plate 120 can have a width W5 between about 20 nm and about 0.5 µm, between about 15 nm and about 0.8 µm, and between about 10 nm and about 1 µm. With width W5, there can be no compressive strain/stress in the channel region. Referring to FIG. 1B, the third portion of conductive plate 120 can have a width W6 between about 20 nm and about 3 µm, between about 15 nm and about 4 µm, and between about 10 nm and about 5 µm. With width W6, there can be some compressive strain/stress in the channel region to increase the carrier mobility by some degree. Referring to FIG. 1C, the third portion of conductive plate 120 can have a width W7 between about 20 nm and about 5 µm, between about 15 nm and about 8 µm, and between about 10 nm and about 10 µm. With width W7, there can be a substantial compressive strain/stress in the channel region to increase the carrier mobility substantially. The carrier mobility is considered to have increased substantially if the carrier mobility has increased by greater than about 5%. Without the third portion of conductive plate 120, defects, such as voids, can be formed between conductive plate 120 and first insulating layer 118. If width W5, width W6, or width W7 is less than about 10 nm, there can be too many defects, such as voids, between conductive plate 120 and first insulating layer 118. If width W5 is greater than about 1 µm, width W6 is greater than about 5 µm, or width W7 is greater than about 10 µm, the size of high-voltage transistor 130B can be too great. The compressive strain/stress in the channel region in FIGS. 1B and 1C caused by width W6 and width W7 can be inversely proportional to the height of gate structure 110B. For example, if the height of gate structure 110B is greater, the compressive strain/stress in the channel region can be smaller. If the height of gate structure 110B is smaller, the compressive strain/stress in the channel region can be greater.

Referring to FIGS. 1A-1C, conductive plate 120 can have a thickness H5 between about 20 nm and about 30 nm, between about 15 nm and about 40 nm, and between about 10 nm and about 50 nm. If thickness H5 is less than about 10 nm, the compressive strain/stress in the drift region, the compressive strain/stress in the channel region, and the tensile strain/stress in the channel region can be too small.

The carrier mobility increase can be too small to reduce resistance in the drift region and the channel region. The RESURF electric field strength between conductive plate 120 and second diffusion region 104 can be too small to generate a sufficient depletion region in second diffusion region 104. Breakdown voltage can be lower with a smaller depletion region. Consequently, the breakdown voltage of high-voltage transistor 130B can be insufficient to meet the power/voltage level demand of the high-voltage power devices. If thickness H5 is greater than about 50 nm, the size of high-voltage transistor 130B can be too great. Conductive plate 120 can also generate too much compressive strain/stress in the drift region and the channel region and generate too many defects.

Second insulating layer 122 can include an insulating material, such as $SiO_x$, SiN, SiCN, SiOCN, and $SiGeO_x$. Second insulating layer 122 can be disposed on conductive plate 120. In some embodiments, the two ends of second insulating layer 122 can be within the two ends of conductive plate 120. In some embodiments, a first end, such as the right end, of second insulating layer 122 can be substantially aligned with a first end, such as the right end, of conductive plate 120. A second end, such as the left end, of second insulating layer 122 can be substantially aligned with a second end, such as the left end, of conductive plate 120. Second insulating layer 122 can have three portions. The first portion of second insulating layer 122 can be substantially parallel to substrate 102. The second portion of second insulating layer 122 can have a curved sidewall covering the curved sidewall of conductive plate 120. The third portion of second insulating layer 122 can be substantially parallel to substrate 102. The second portion of second insulating layer 122 can be interposed between the first and third portions of second insulating layer 122. Second insulating layer 122 can have a thickness H6 between about 10 nm and about 50 nm. Second insulating layer 122 can reduce defect formation between conductive plate 120 and ESL 124.

S/D contact structures 128A and 128D, gate contact structures 128B (contact structures for gate structure 110B are not visible in FIGS. 1A-1C), and conductive plate contact structures 128C can include a suitable conductive material, such as W, Mo, Ni, bismuth (Bi), scandium (Sc), Ti, Cu, Co, Ag, Al, titanium aluminum nitride (TiAlN), tantalum carbide (TaC), tantalum carbonitride (TaCN), tantalum silicon nitride (TaSiN), manganese (Mn), zirconium (Zr), TiN, TaN, Ru, tungsten nitride (WN), titanium carbide (TiC), TiAlC, TaAlC, metal alloys, and combinations thereof. S/D contact structures 128A and 128D can be disposed on silicide layers 116 formed on S/D regions 108A and 108C. Gate contact structures 128B can be disposed on silicide layer 116 formed on gate structure 110A. Conductive plate contact structures 128C can be disposed on conductive plate 120 and through ILD layer 126, ESL 124, and second insulating layer 122.

In some embodiments, barrier layers (not shown in FIGS. 1A-1C) can be disposed before S/D contact structures 128A and 128D, gate contact structures 128B, and conductive plate contact structures 128C are formed. Barrier layers can include any suitable materials, such as a metal oxide ($MO_x$), a metal nitride ($MN_x$), a metal carbide ($MC_x$), a metalaluminate ($MAl_xO_y$), a combination of metal oxides ($M1O_x/M2O_x$), a metal-silicate ($MSiO_x$), and combinations thereof. In some embodiments, the metal in the above-mentioned materials is a transition metal, such as hafnium (Hf), Zr, Ti, and Al, a rare earth metal, such as yttrium (Y), ytterbium (Yb), erbium (Er), and combinations thereof. In some embodiments, barrier layers can include dielectric materials, such as SiN, SiOCN, SiCN, other suitable insulating materials, and combination thereof. In some embodiments, the thickness of barrier layers can be between about 1 nm and about 10 nm.

Figure 2:
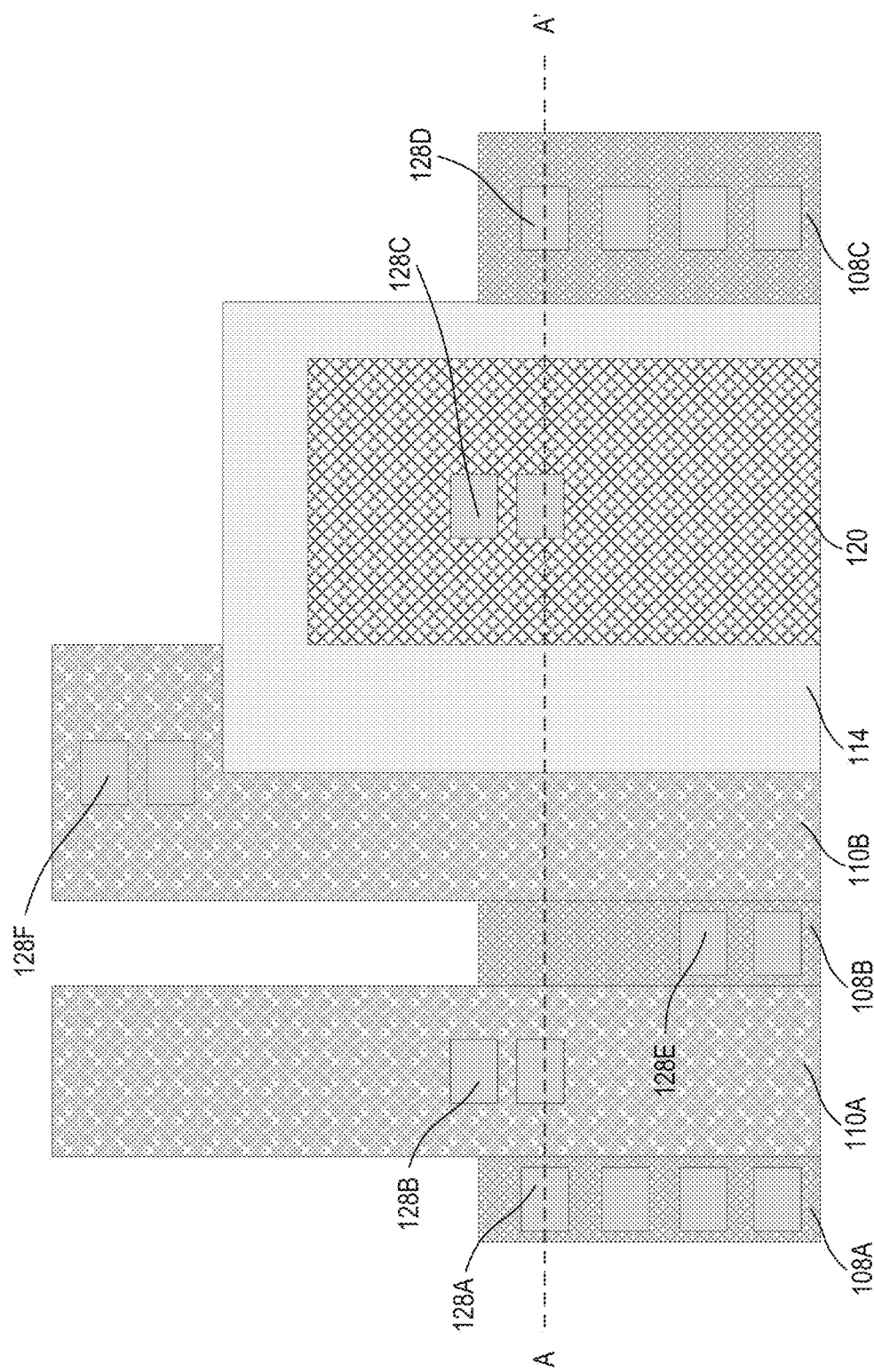
FIG. 2 illustrates a top view of a strained transistor with a conductive plate, in accordance with some embodiments.

FIG. 2 illustrates a top view of a strained transistor with a conductive plate, according to some embodiments. Gate structures 110A and 110B can be disposed on S/D regions 108A, 108B, and 108C. Protective layer 114 can be disposed on a portion of gate structure 110B. Conductive plate 120 can be disposed on protective layer 114. S/D region 108A can include one or more S/D contact structures 128A. S/D region 108B can include one or more S/D contact structures 128E. S/D region 108C can include one or more S/D contact structures 128D. Gate structure 110A can include one or more gate contact structures 128B. Gate structure 110B can include one or more gate contact structures 128F. Conductive plate 120 can include one or more conductive plate contact structures 128C. In some embodiments, conductive plate 120 can include one or more conductive plate contact structures 128C side by side in the x-direction. In some embodiments, strained transistors 100A-100C as shown in FIGS. 1A-1C can be a cross-sectional view of the strained transistor as shown in FIG. 2 along line A-A'.

Figure 4:
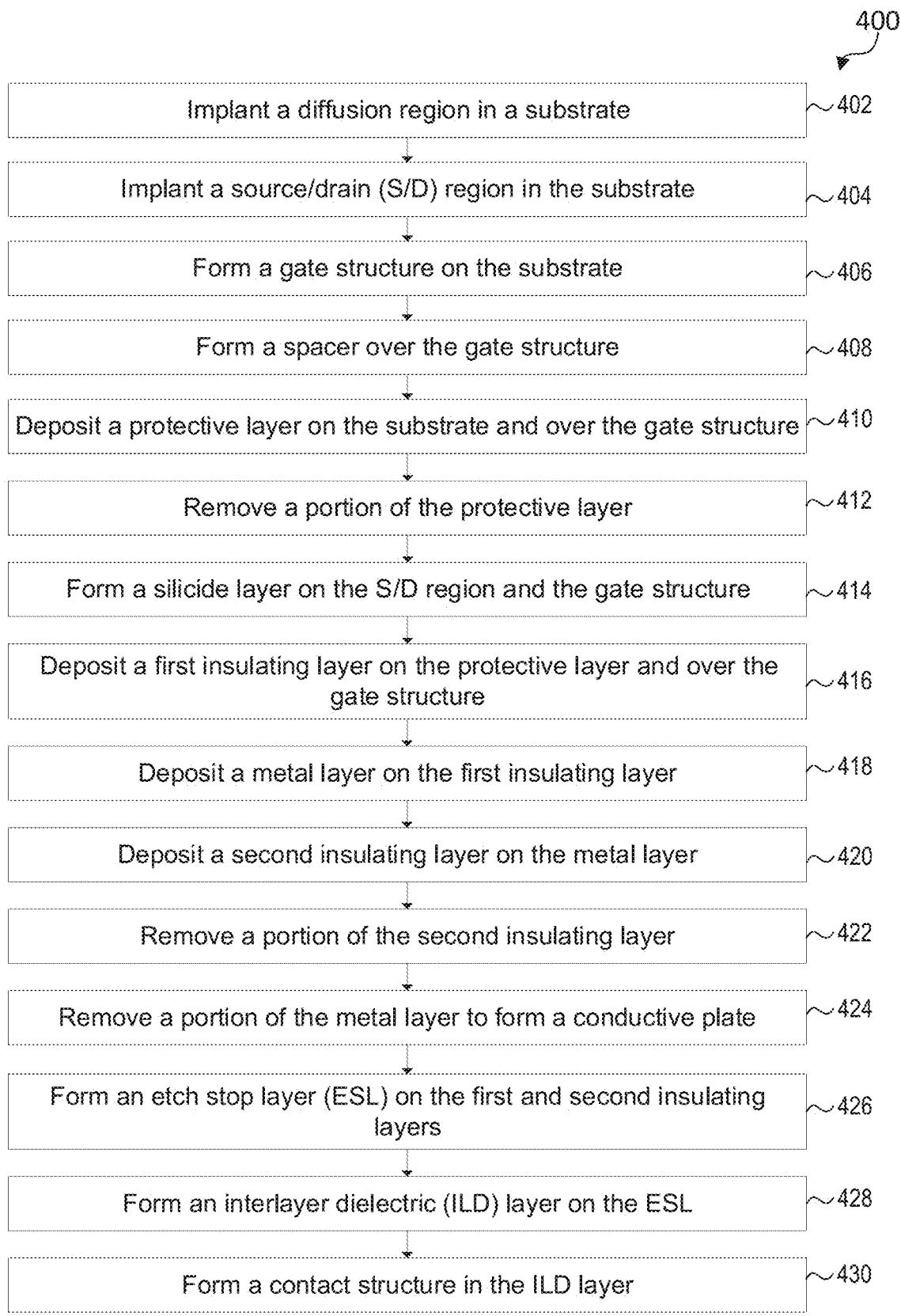
FIG. 4 is a flow diagram of a method for fabricating strained transistors with a conductive plate, in accordance with some embodiments.

FIG. 4 is a flow diagram of a method 400 for fabricating strained transistors 100A-100C as shown in FIGS. 1A-1C, according to some embodiments. For illustrative purposes, the operations illustrated in FIG. 4 will be described with reference to the example fabrication process for fabricating strained transistors 100A-100C as illustrated in FIGS. 5-14, 15A-15C, 16A-16C, 17A-17C, 18A-18C, and 19A-19C. FIGS. 5-14, 15A-15C, 16A-16C, 17A-17C, 18A-18C, and 19A-19C are cross-sectional views of strained transistors 100A-100C at various stages of fabrication, according to some embodiments. Additional fabrication operations can be performed between the various operations of method 400 and are omitted for simplicity. These additional fabrication operations are within the spirit and the scope of this disclosure. Moreover, not all operations may be required to perform the disclosure provided herein. Additionally, some of the operations can be performed simultaneously or in a different order than the ones shown in FIG. 4. Elements in FIGS. 5-14, 15A-15C, 16A-16C, 17A-17C, 18A-18C, and 19A-19C with the same annotations as the elements in FIGS. 1A-1C and FIG. 2 are described above. It should be noted that method 400 may not produce complete strained transistors 100A-100C. Accordingly, it is understood that additional processes can be provided before, during, and after method 400, and that some other processes may only be briefly described herein.

Referring to FIG. 4, in operation 402, a diffusion region is implanted in a substrate. For example, as shown in FIG. 5, first and second diffusion regions 106 and 104 can be implanted in substrate 102. The implantation dopant species can be an n-type dopant, such as P and As, or a p-type dopant, such as B, In, Al, and Ga. The ion beam energy can be between about 0.5 keV and about 15 keV. The dose of the dopants can be between about $0.5 \times 10^{15}$ ions/cm$^2$ and about $1.5 \times 10^{16}$ ions/cm$^2$. The tilt angle for the ion beam can be between about 0° and about 30°. The twist angle for the ion beam can be flexible. In some embodiments, a post-implantation anneal process can be performed.

Figure 6:
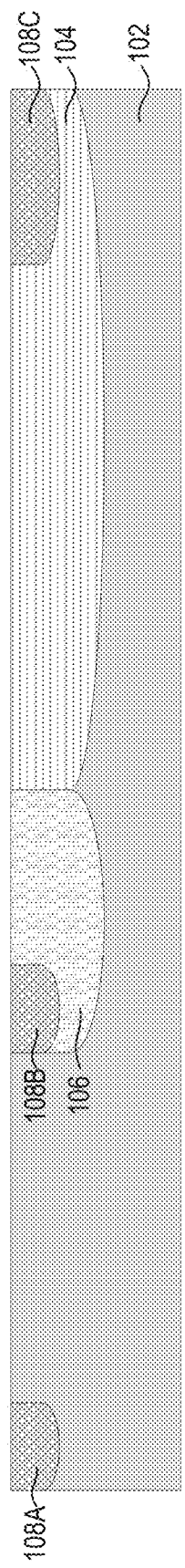

Referring to FIG. 4, in operation 404, a S/D region is implanted in a substrate. For example, as shown in FIG. 6, S/D regions 108A-108C can be implanted in substrate 102. S/D regions 108A-108C can be implanted in a manner similar to that described with reference to FIG. 5 and operation 402 of FIG. 4. The dose of the dopants for forming S/D regions 108A-108C can be higher than that for forming first and second diffusion regions 106 and 104.

Figure 7:
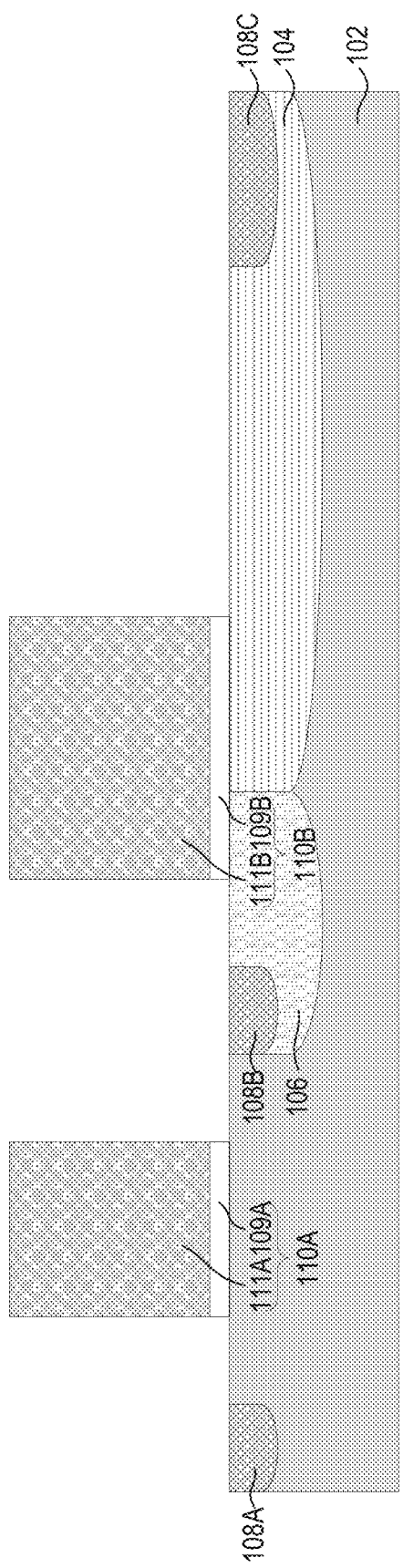

Referring to FIG. 4, in operation 406, a gate structure is formed on the substrate. For example, as shown in FIG. 7, gate structures 110A and 110B can be formed on substrate 102. The areas to form gate structures 110A and 110B can be patterned by a photolithography process. In some embodiments, an IO layer (not shown in FIG. 7) of gate structures 110A and 110B can be formed by a thermal oxidation process, a chemical vapor deposition (CVD) process, or a physical vapor deposition (PVD) process. Gate dielectric layers 109A and 109B of gate structures 110A and 110B can be deposited by a CVD process or a PVD process. A WFM layer (not shown in FIG. 7) of gate structures 110A and 110B can be deposited by a CVD process, a PVD process, or a metal-organic chemical vapor deposition (MOCVD) process. A metal fill layer (not shown in FIG. 7) of gate structures 110A and 110B can be deposited by a CVD process, a PVD process, or a MOCVD process.

Figure 8:
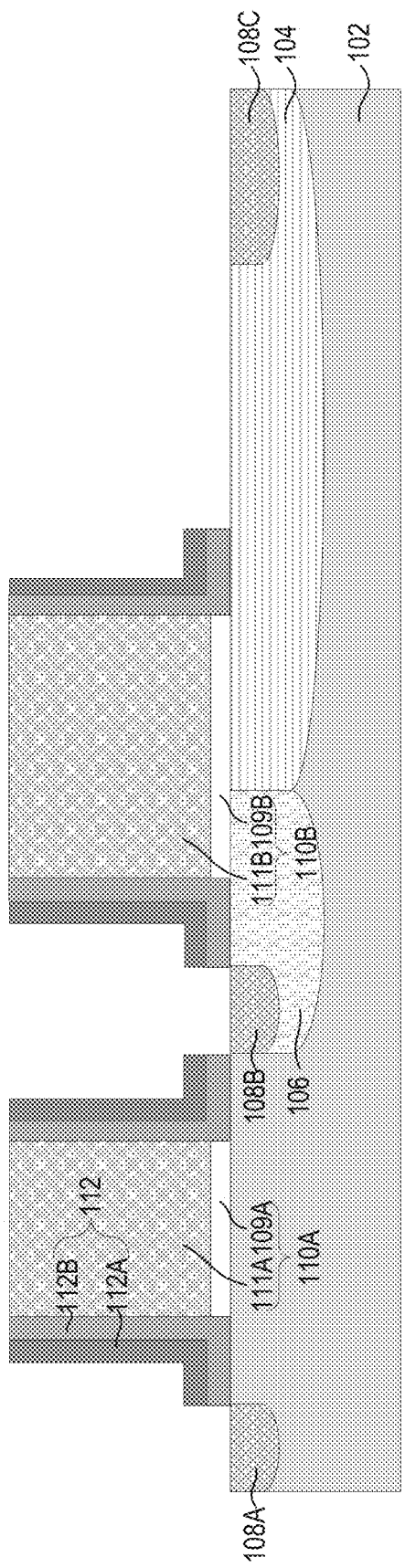

Referring to FIG. 4, in operation 408, a spacer is formed over the gate structure. For example, as shown in FIG. 8, spacers 112 including first and second spacer layers 112A and 112B can be formed over gate structures 110A and 110B. The areas to form spacers 112 can be patterned by a photolithography process. First and second spacer layers 112A and 112B can be deposited by a CVD process or a PVD process. In some embodiments, a chemical mechanical planarization (CMP) process can be performed to remove excess first and second spacer layers 112A and 112B. In some embodiments, gate structures 110A and 110B and spacers 112 can be formed before S/D regions 108A and 108B are formed, and spacers 112 can be used as masking layers to define the areas where S/D regions 108A and 108B can be formed. In some embodiments, S/D regions 108A and 108B can extend below spacers 112 because of the thermal diffusion and/or the implantation bombardment of the dopants.

Figure 9:
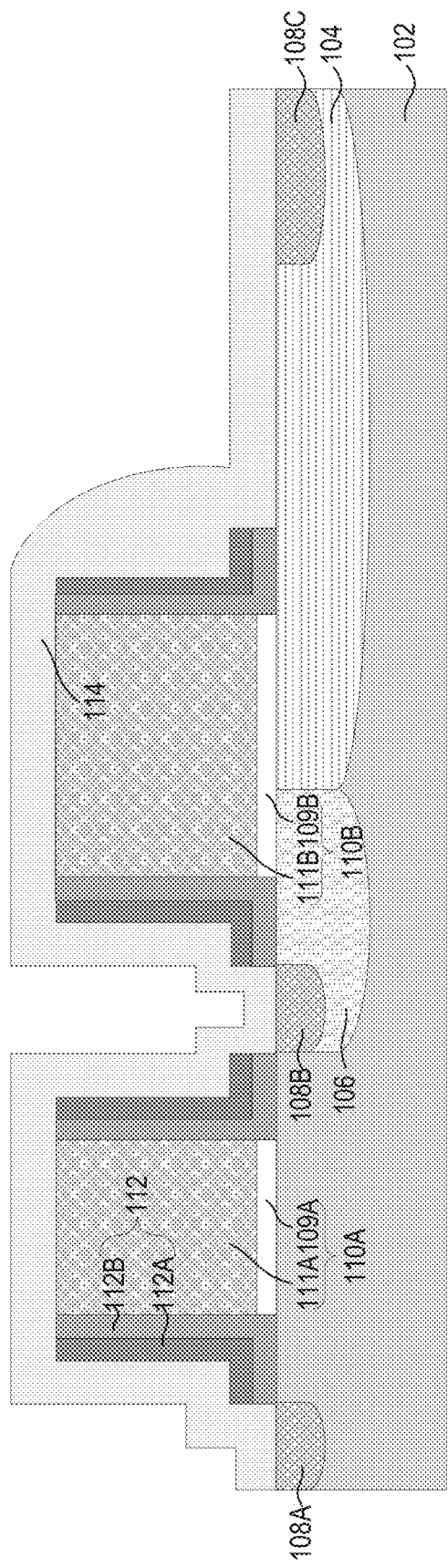

Referring to FIG. 4, in operation 410, a protective layer is deposited on the substrate and over the gate structure. For example, as shown in FIG. 9, protective layer 114 can be deposited on substrate 102 and over gate structures 110A and 110B. Protective layer 114 can be blanket deposited by a CVD process or a PVD process.

Figure 10:
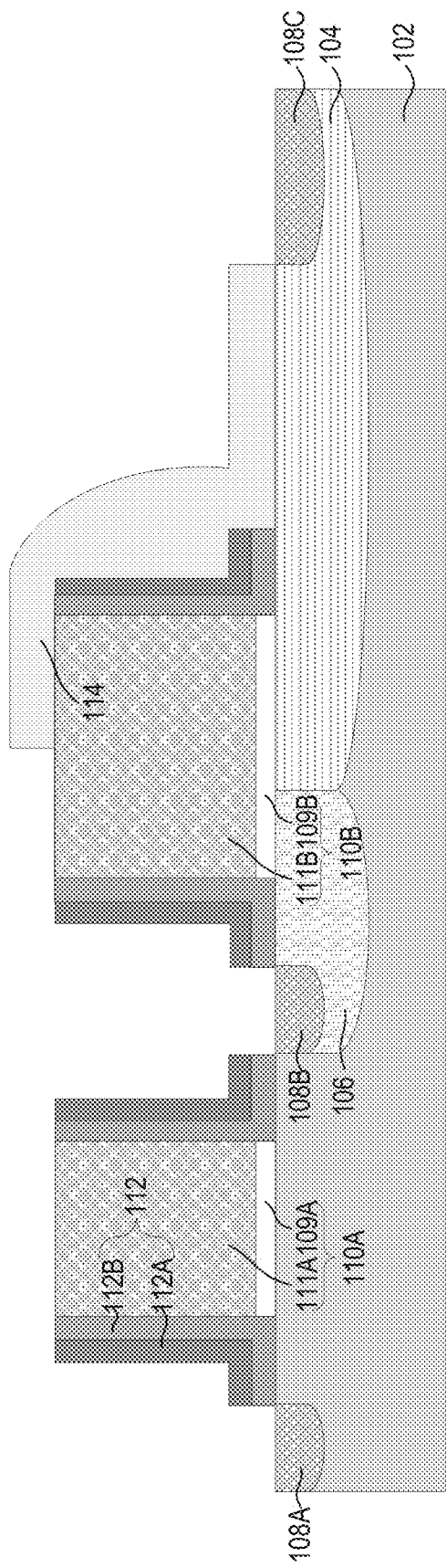

Referring to FIG. 4, in operation 412, a portion of the protective layer is removed. For example, as shown in FIG. 10, portions of protective layer 114 can be removed. Portions of protective layer 114 that remain can be protected by a photoresist layer (not shown in FIG. 10). In some embodiments, portions of protective layer 114 can be removed by a dry etch process or a wet etch process. In some embodiments, the dry etch process can include etchants with an (i) oxygen-containing gas; (ii) methane ($CH_4$); (iii) a fluorine-containing gas (e.g., carbon tetrafluoride ($CF_4$), sulfur hexafluoride ($SF_6$), difluoromethane ($CH_2F_2$), trifluoromethane ($CHF_3$), and/or hexafluoroethane ($C_2F_6$)); (iv) a chlorine-containing gas (e.g., chlorine ($Cl_2$), chloroform ($CHCl_3$), carbon tetrachloride ($CCl_4$), and/or boron trichloride ($BCl_3$)); (v) a bromine-containing gas (e.g., hydrogen bromide (HBr) and/or bromoform ($CHBr_3$)); (vi) an iodine-containing gas; (vii) other suitable etching gases and/or plasmas; or combinations thereof. In some embodiments, the wet etch process can include etching in diluted hydrofluoric acid (DHF), potassium hydroxide (KOH) solution, hydrogen peroxide ($H_2O_2$), ammonia ($NH_3$), a solution containing hydrofluoric acid (HF), nitric acid ($HNO_3$), acetic acid ($CH_3COOH$), or combinations thereof. The etch process to remove portions of protective layer 114 can be a timed etch.

Figure 11:
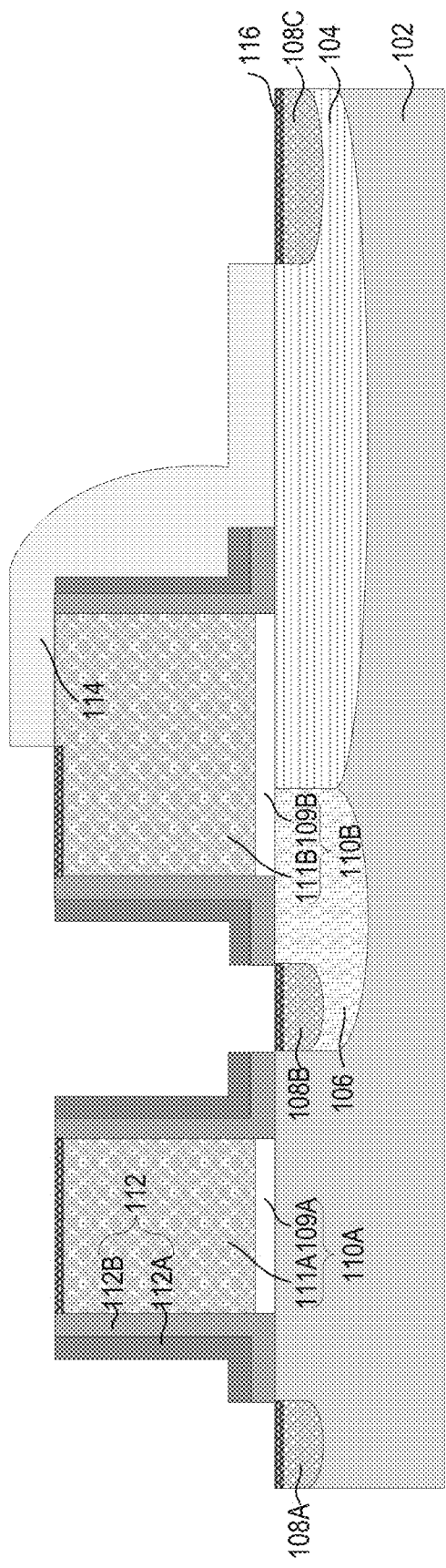

Referring to FIG. 4, in operation 414, a silicide layer is formed on the S/D region and the gate structure. For example, as shown in FIG. 11, silicide layers 116 can be formed on S/D regions 108A-108C, gate structure 110A, and a portion of gate structure 110B that is exposed by protective layer 114. In some embodiments, silicide layers 116 can be formed by depositing a metal by a CVD process, a PVD process, or an atomic layer deposition (ALD) process followed by a thermal anneal process. In some embodiments, silicide layers 116 can be formed by an ion implantation process using a metal as the implantation species.

Figure 12:
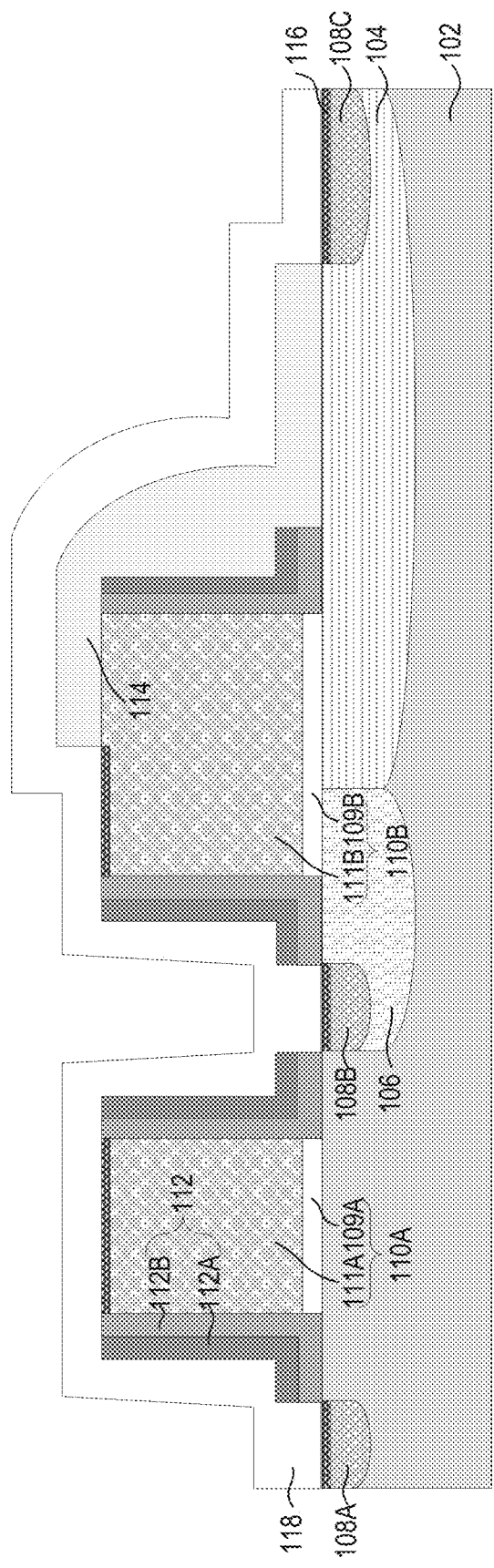

Referring to FIG. 4, in operation 416, a first insulating layer is deposited on the protective layer and over the gate structure. For example, as shown in FIG. 12, first insulating layer 118 can be deposited on substrate 102, S/D regions 108A-108C, silicide layers 116, protective layer 114, over gate structures 110A and 110B, and over spacers 112. First insulating layer 118 can be blanket deposited by a CVD process or a PVD process.

Figure 13:
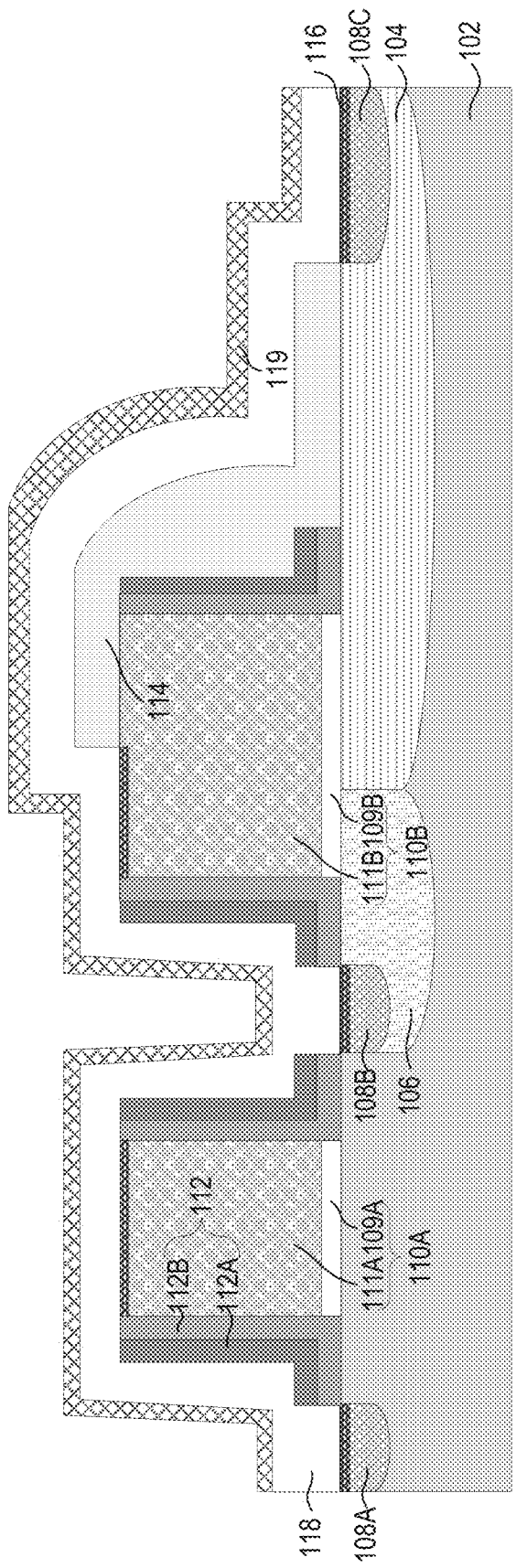

Referring to FIG. 4, in operation 418, a metal layer is deposited on the first insulating layer. For example, as shown in FIG. 13, metal layer 119 can be deposited on first insulating layer 118. Metal layer 119 can be blanket deposited by a CVD process, a PVD process, a MOCVD process, or a sputtering process.

Figure 14:
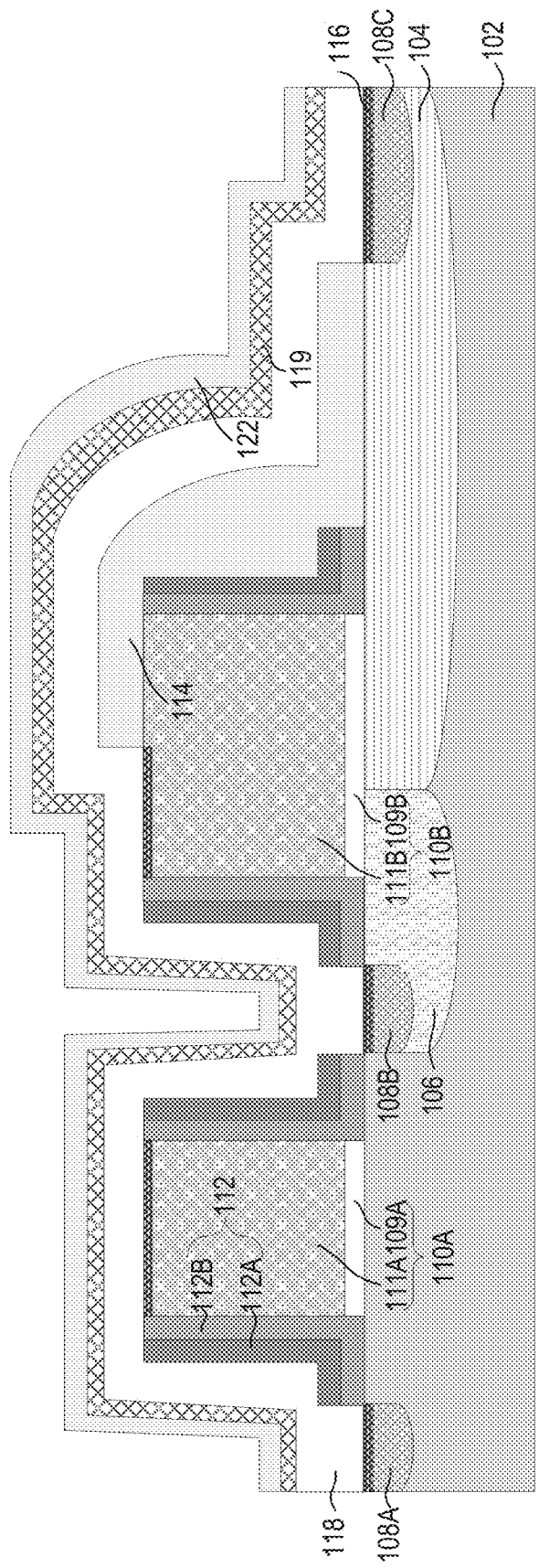

Referring to FIG. 4, in operation 420, a second insulating layer is deposited on the metal layer. For example, as shown in FIG. 14, second insulating layer 122 can be deposited on metal layer 119. Second insulating layer 122 can be blanket deposited by a CVD process or a PVD process.

Figure 15A:
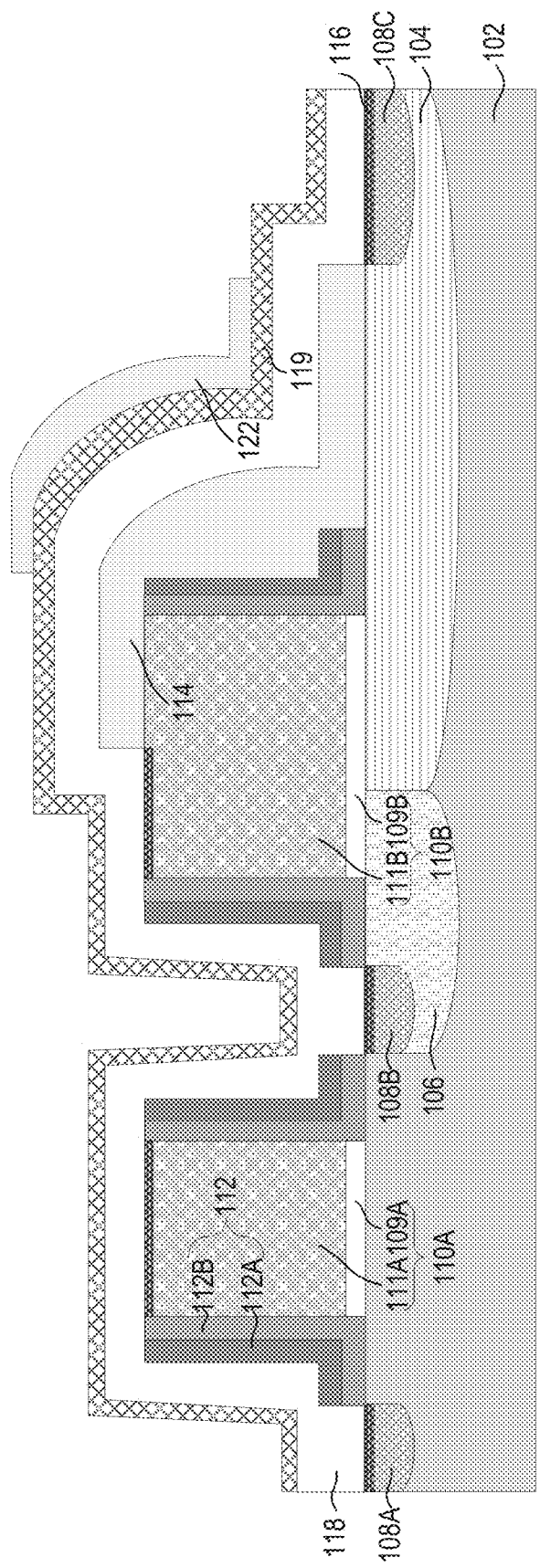
Figure 15B:
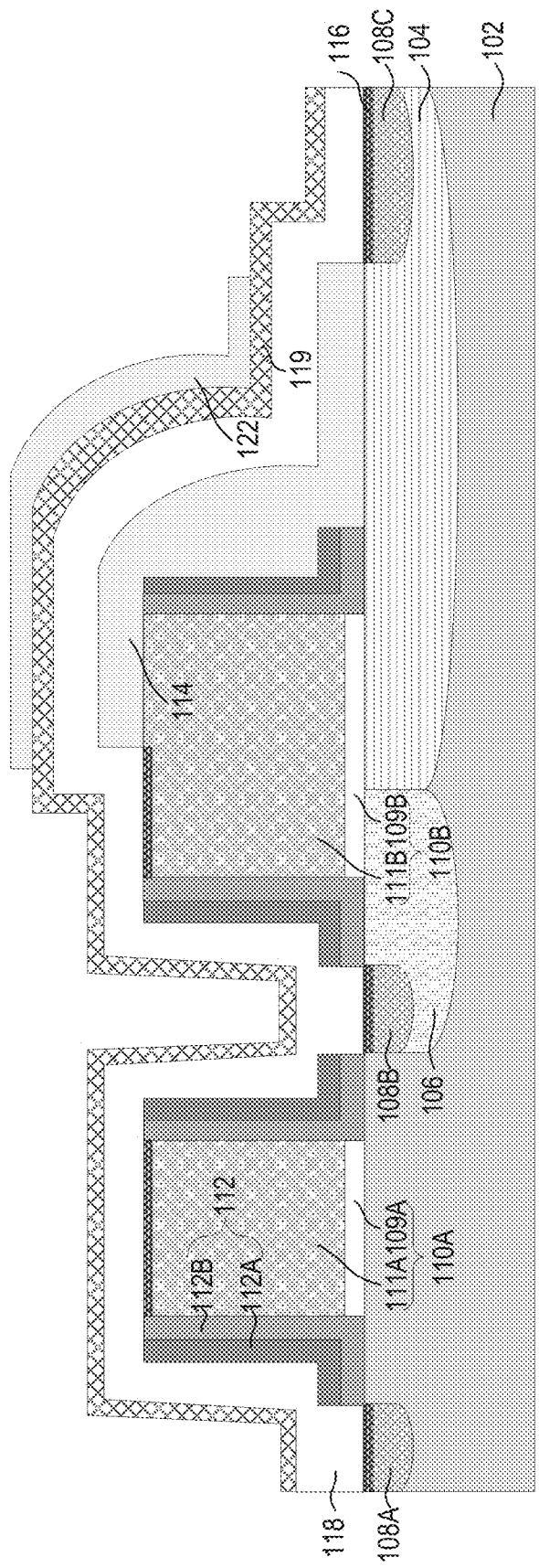
Figure 15C:
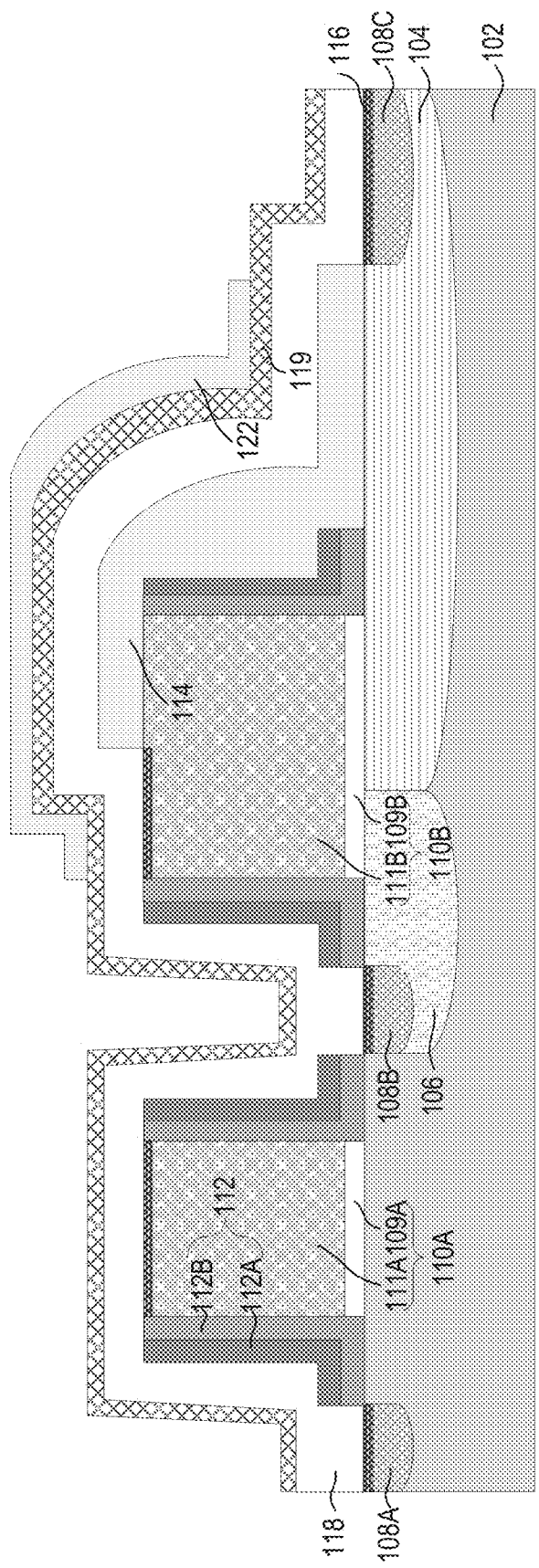

Referring to FIG. 4, in operation 422, a portion of the second insulating layer is removed. For example, as shown in FIGS. 15A-15C, portions of second insulating layer 122 can be removed. FIG. 15A is the cross-sectional view of strained transistor 100A as shown in FIG. 1A at operation 422 in the fabrication process. FIG. 15B is the cross-sectional view of strained transistor 100B as shown in FIG. 1B at operation 422 in the fabrication process. FIG. 15C is the cross-sectional view of strained transistor 100C as shown in FIG. 1C at operation 422 in the fabrication process. Portions of second insulating layer 122 can be removed by a dry etch process or a wet etch process in a manner similar to that described with reference to FIG. 10 and operation 412 of FIG. 4. In some embodiments, once the etching reaches metal layer 119, metal layer 119 can stop the etching of second insulating layer 122. Portions of second insulating layer 122 that remain can be protected by a photoresist layer (not shown in FIGS. 15A-15C). The amount of second insulating layer 122 to be removed depends on the device, such as shown in the variations among FIGS. 15A-15C.

Figure 16A:
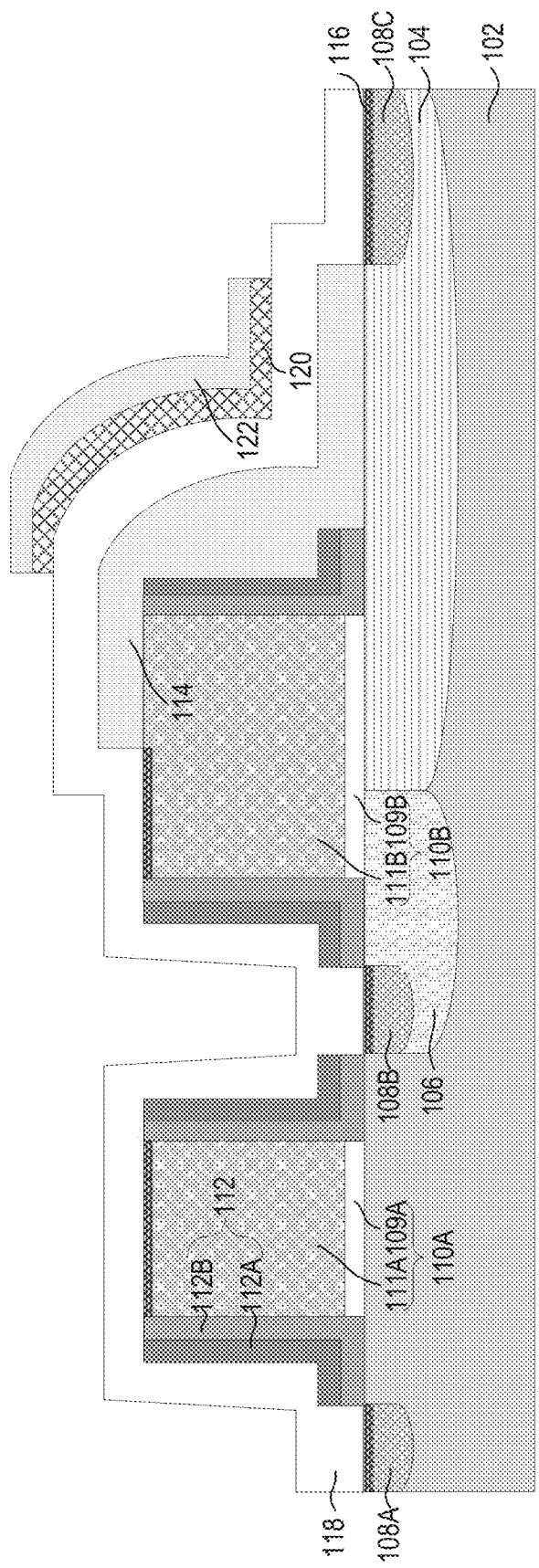
Figure 16B:
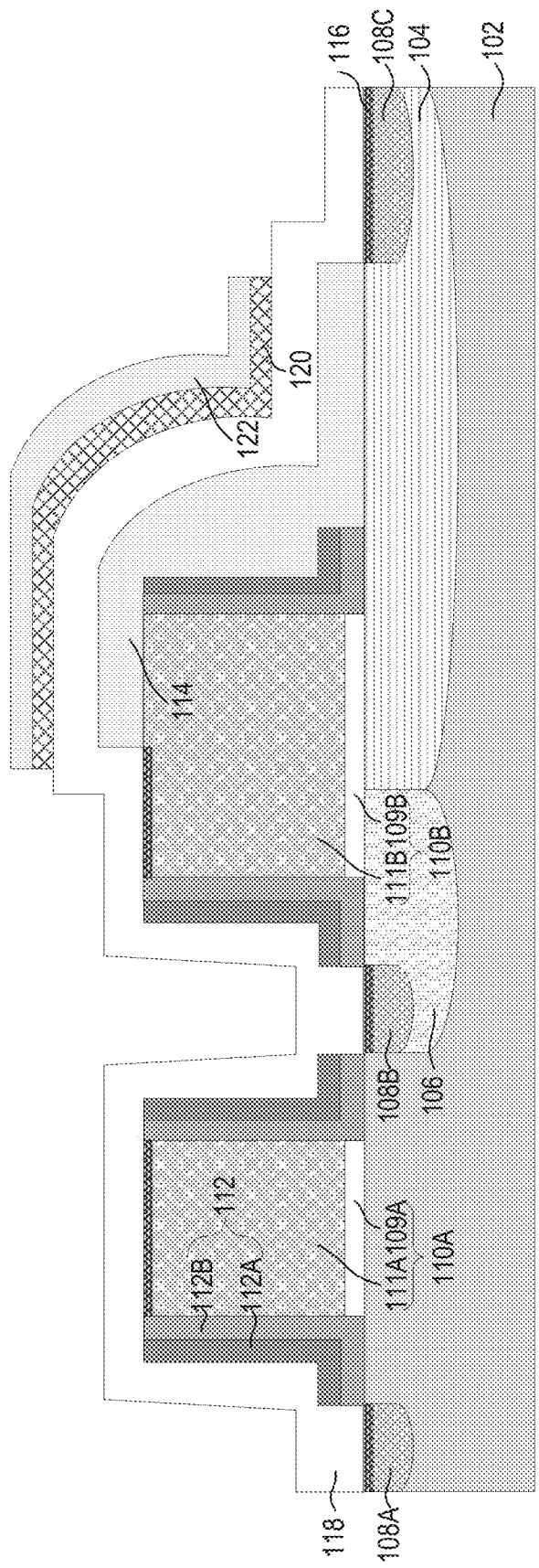
Figure 16C:
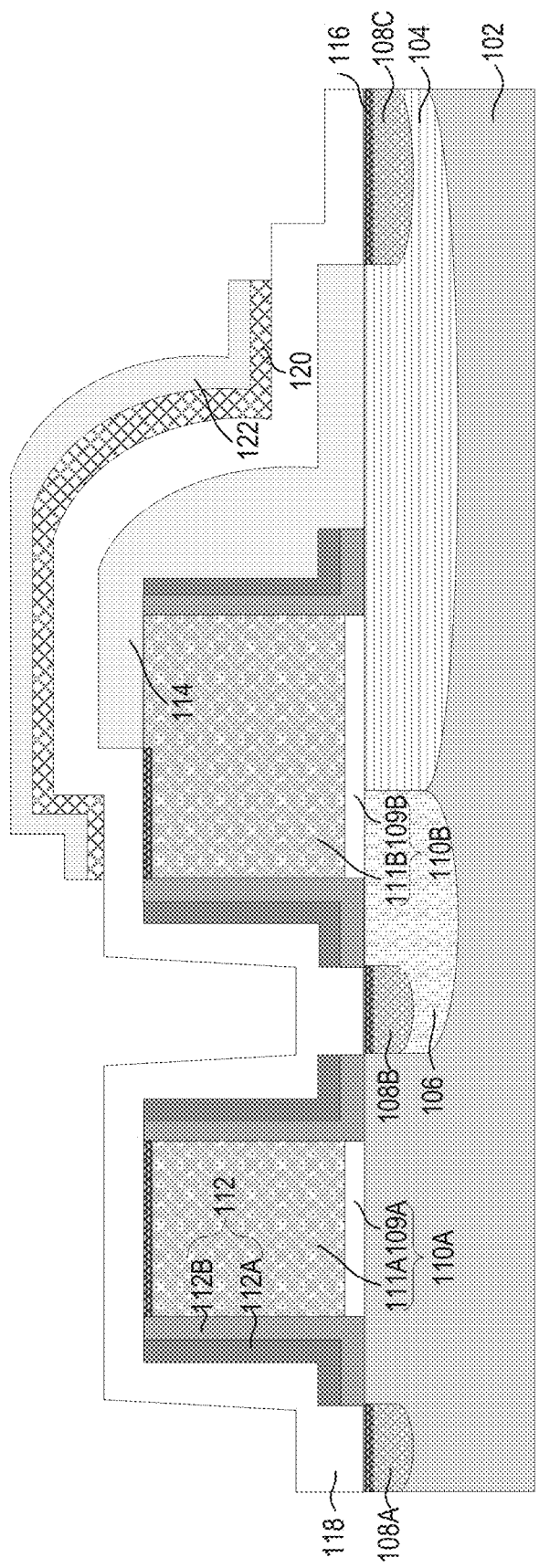

Referring to FIG. 4, in operation 424, a portion of the metal layer is removed to form a conductive plate. For example, as shown in FIGS. 16A-16C, portions of metal layer 119 can be removed to form conductive plate 120. FIG. 16A is the cross-sectional view of strained transistor 100A as shown in FIG. 1A at operation 424 in the fabrication process. FIG. 16B is the cross-sectional view of strained transistor 100B as shown in FIG. 1B at operation 424 in the fabrication process. FIG. 16C is the cross-sectional view of strained transistor 100C as shown in FIG. 1C at operation 424 in the fabrication process. Portions of metal layer 119 can be removed by a dry etch process or a wet etch process in a manner similar to that described with reference to FIG. 10 and operation 412 of FIG. 4. Portions of metal layer 119 that remain to form conductive plate 120 can be protected by second insulating layer 122. The amount of metal layer 119 to be removed depends on the device, such as shown in the variations among FIGS. 16A-16C.

Figure 17A:
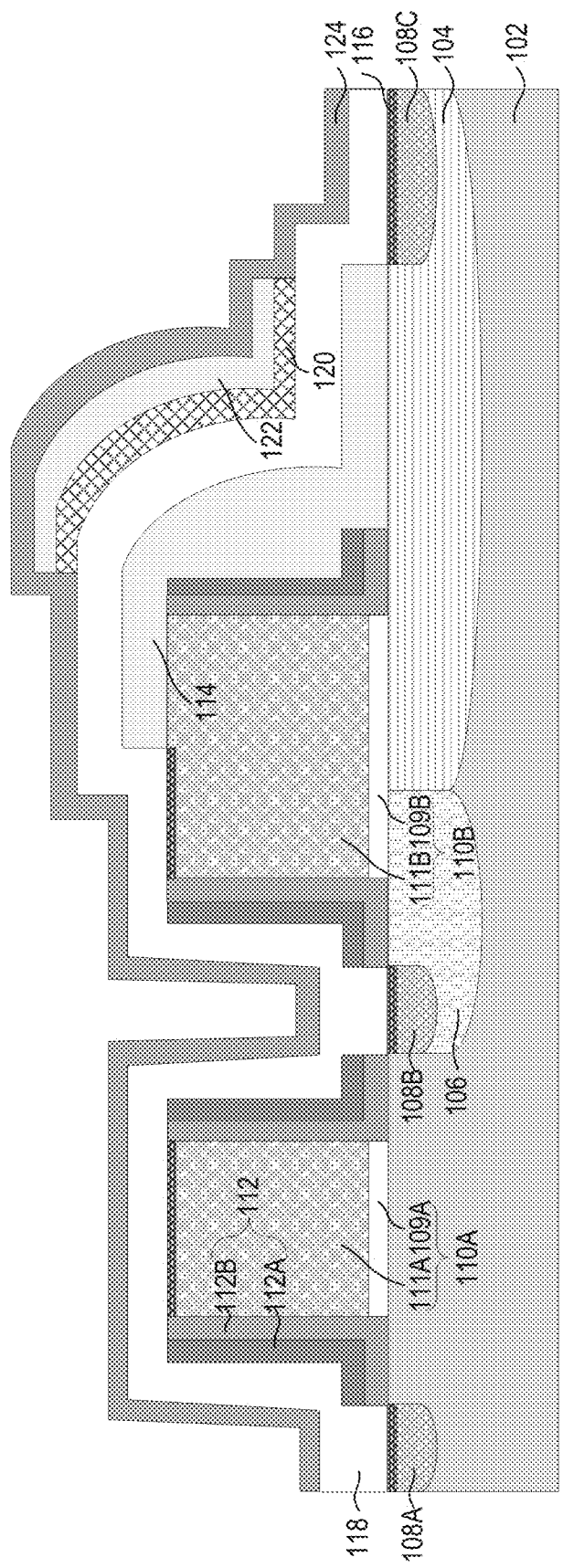
Figure 17B:
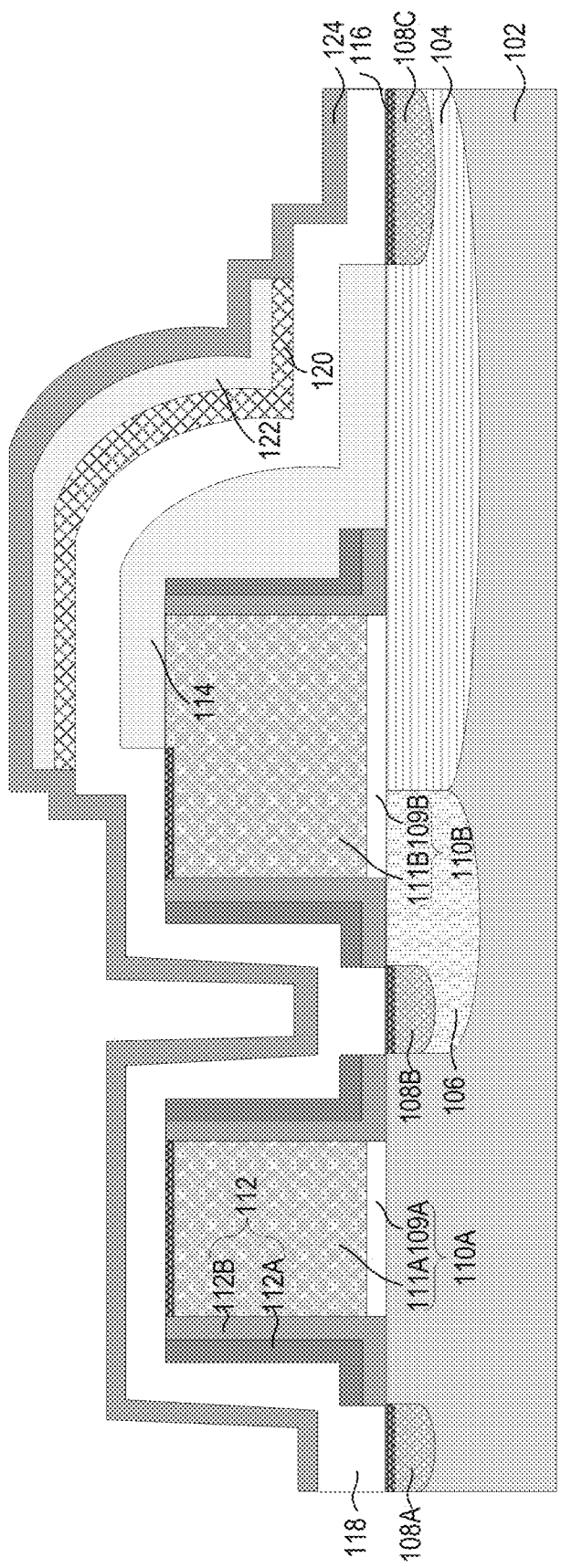
Figure 17C:
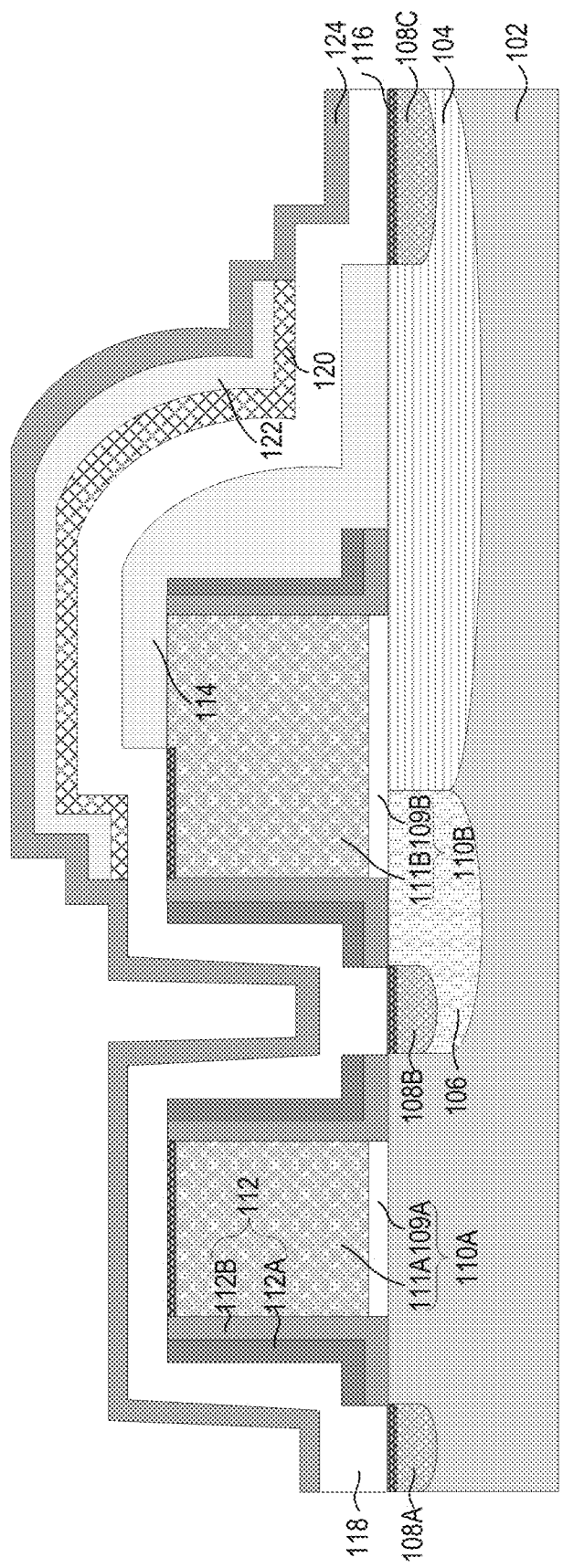

Referring to FIG. 4, in operation 426, an ESL is deposited on the first and second insulating layers. For example, as shown in FIGS. 17A-17C, ESL 124 can be deposited on first and second insulating layers 118 and 122. FIG. 17A is the cross-sectional view of strained transistor 100A as shown in FIG. 1A at operation 426 in the fabrication process. FIG. 17B is the cross-sectional view of strained transistor 100B as shown in FIG. 1B at operation 426 in the fabrication process. FIG. 17C is the cross-sectional view of strained transistor 100C as shown in FIG. 1C at operation 426 in the fabrication process. ESL 124 can be blanket deposited by a CVD process or a PVD process.

Figure 18A:
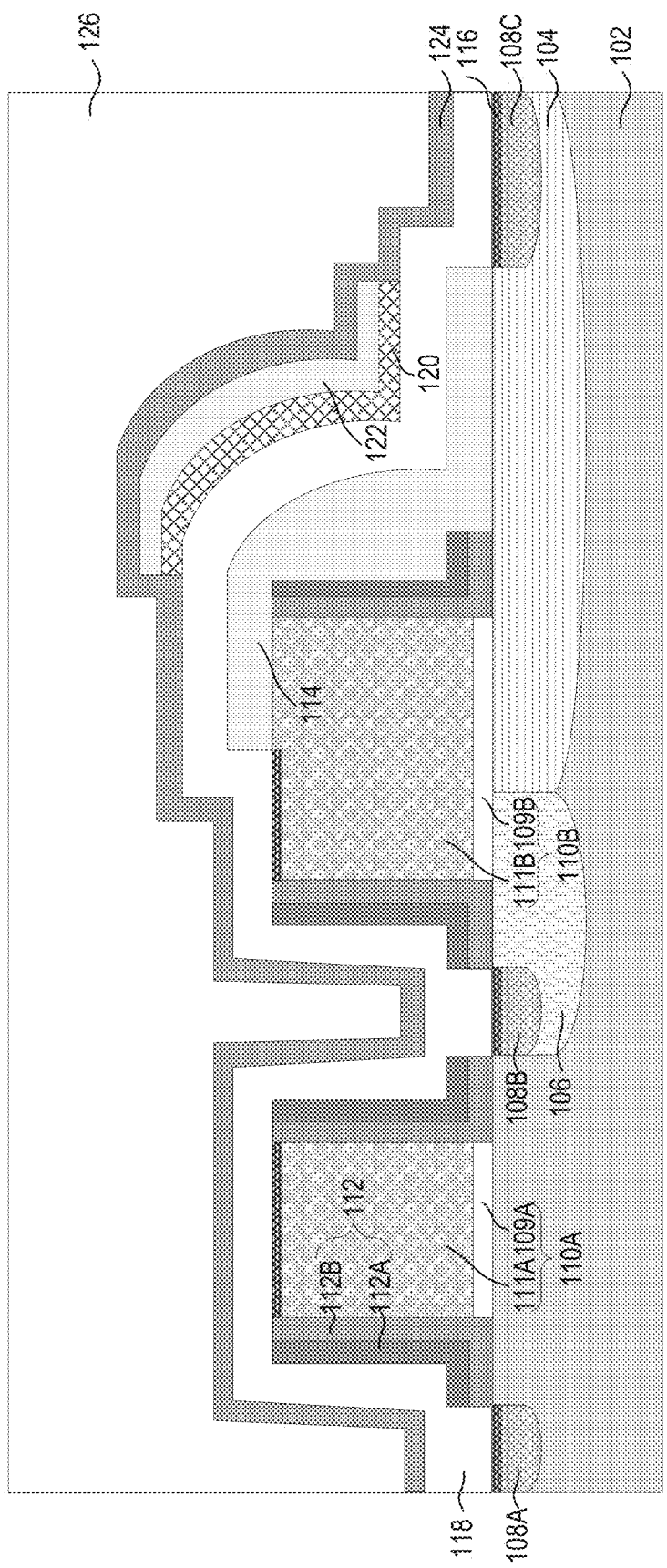
Figure 18B:
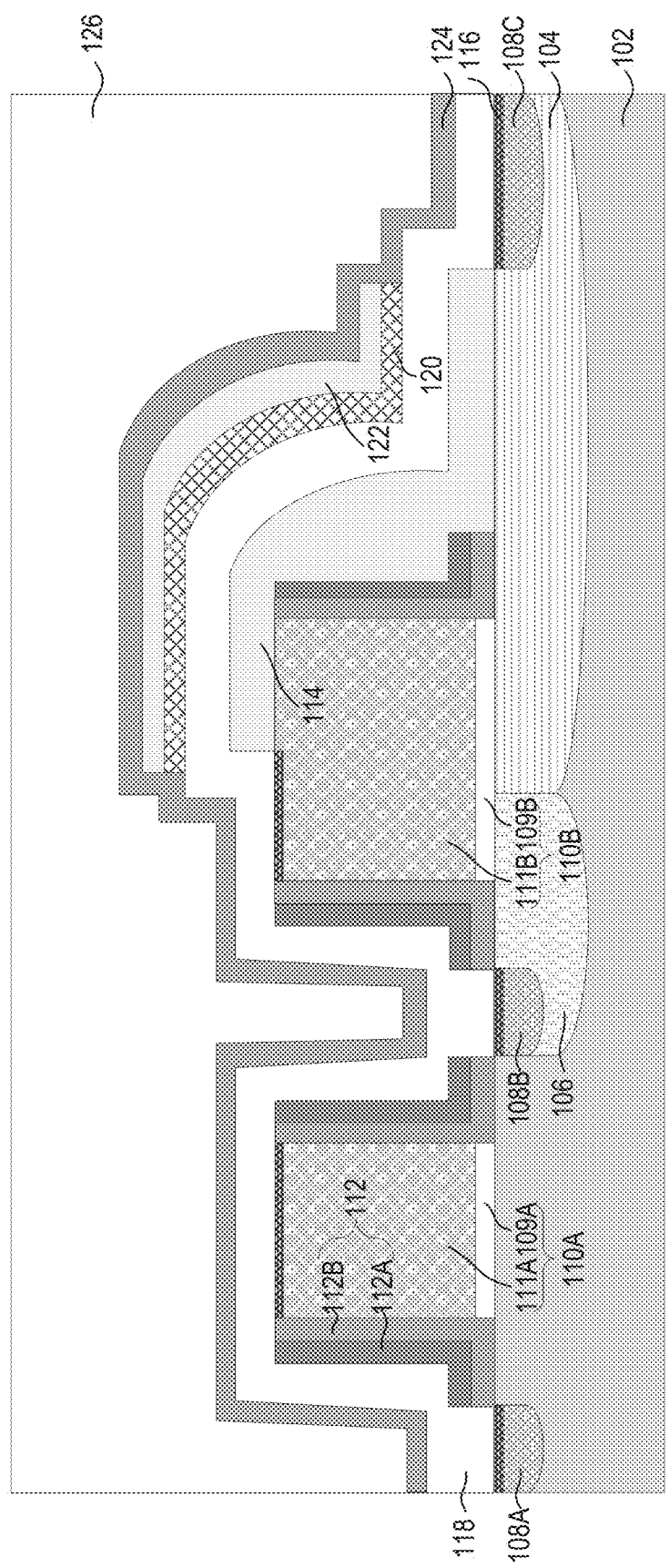
Figure 18C:
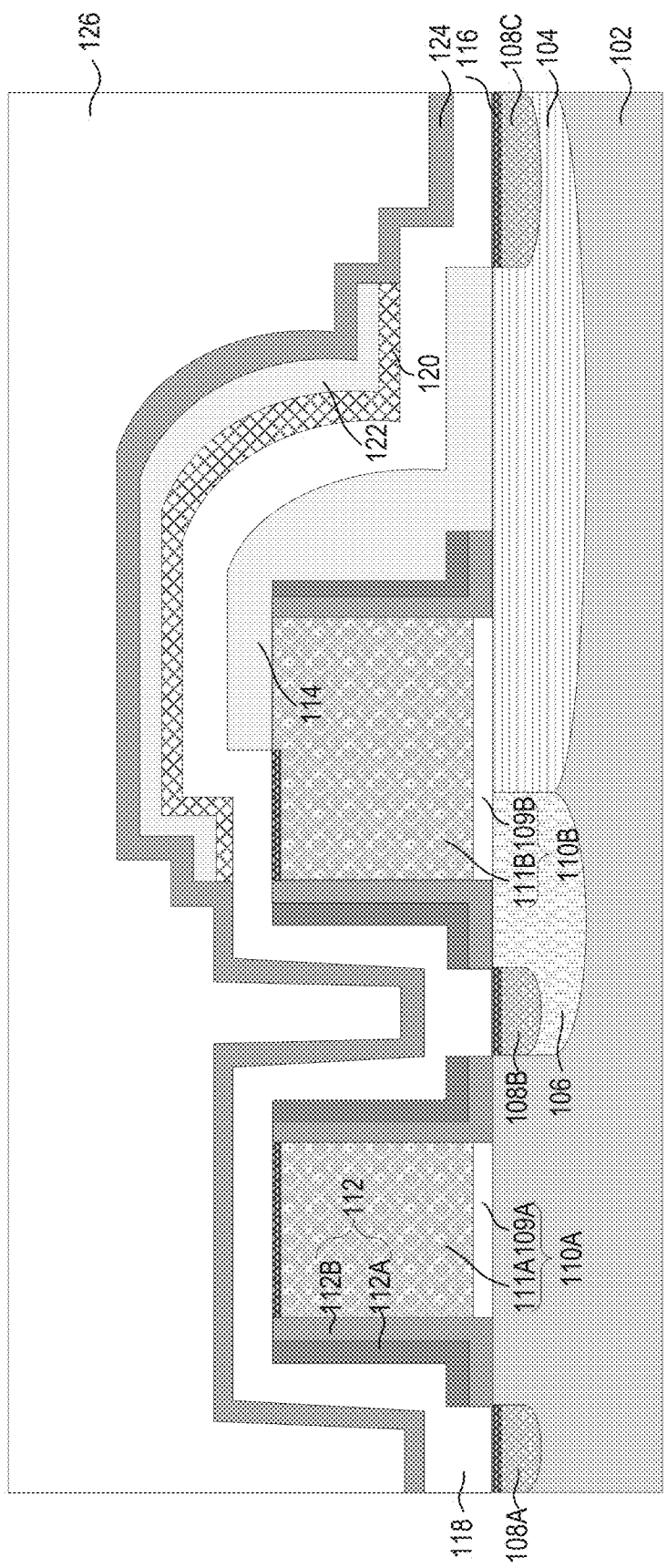

Referring to FIG. 4, in operation 428, an ILD layer is deposited on the ESL. For example, as shown in FIGS. 18A-18C, ILD layer 126 can be deposited on ESL 124. FIG. 18A is the cross-sectional view of strained transistor 100A as shown in FIG. 1A at operation 428 in the fabrication process. FIG. 18B is the cross-sectional view of strained transistor 100B as shown in FIG. 1B at operation 428 in the fabrication process. FIG. 18C is the cross-sectional view of strained transistor 100C as shown in FIG. 1C at operation 428 in the fabrication process. ILD layer 126 can be blanket deposited by a CVD process or a PVD process. In some embodiments, a CMP process can be performed to remove excess ILD layer 126 and to planarize a top surface of ILD layer 126.

Figure 19A:
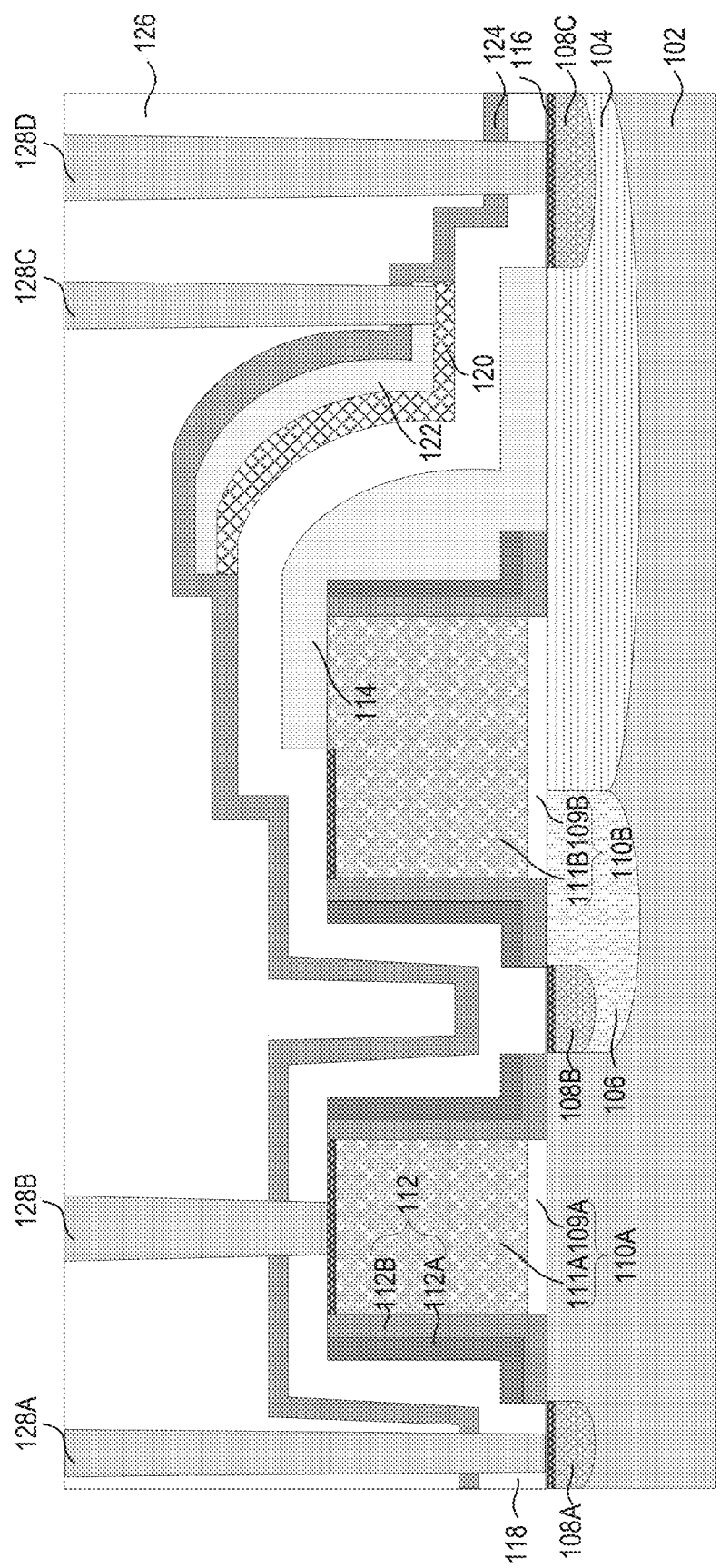
Figure 19B:
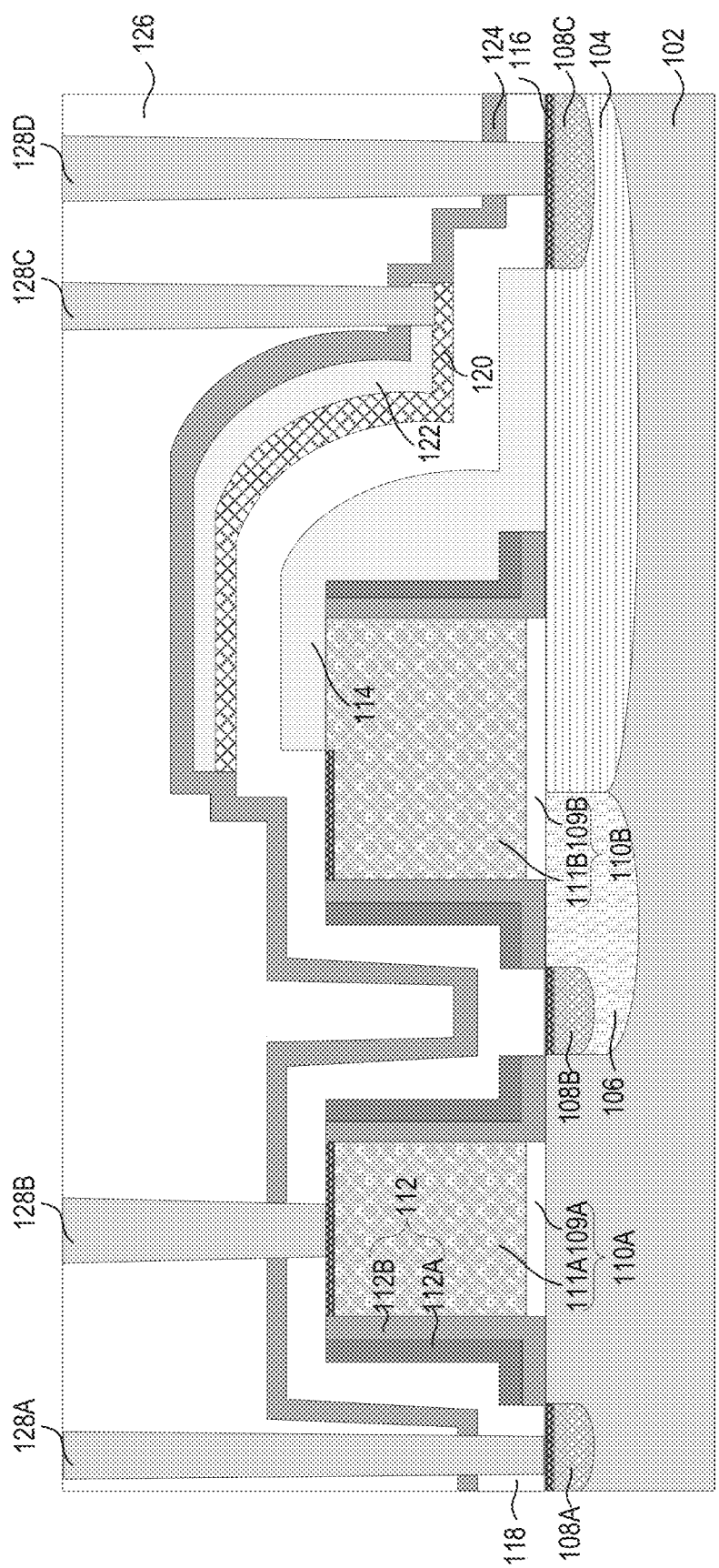
Figure 19C:
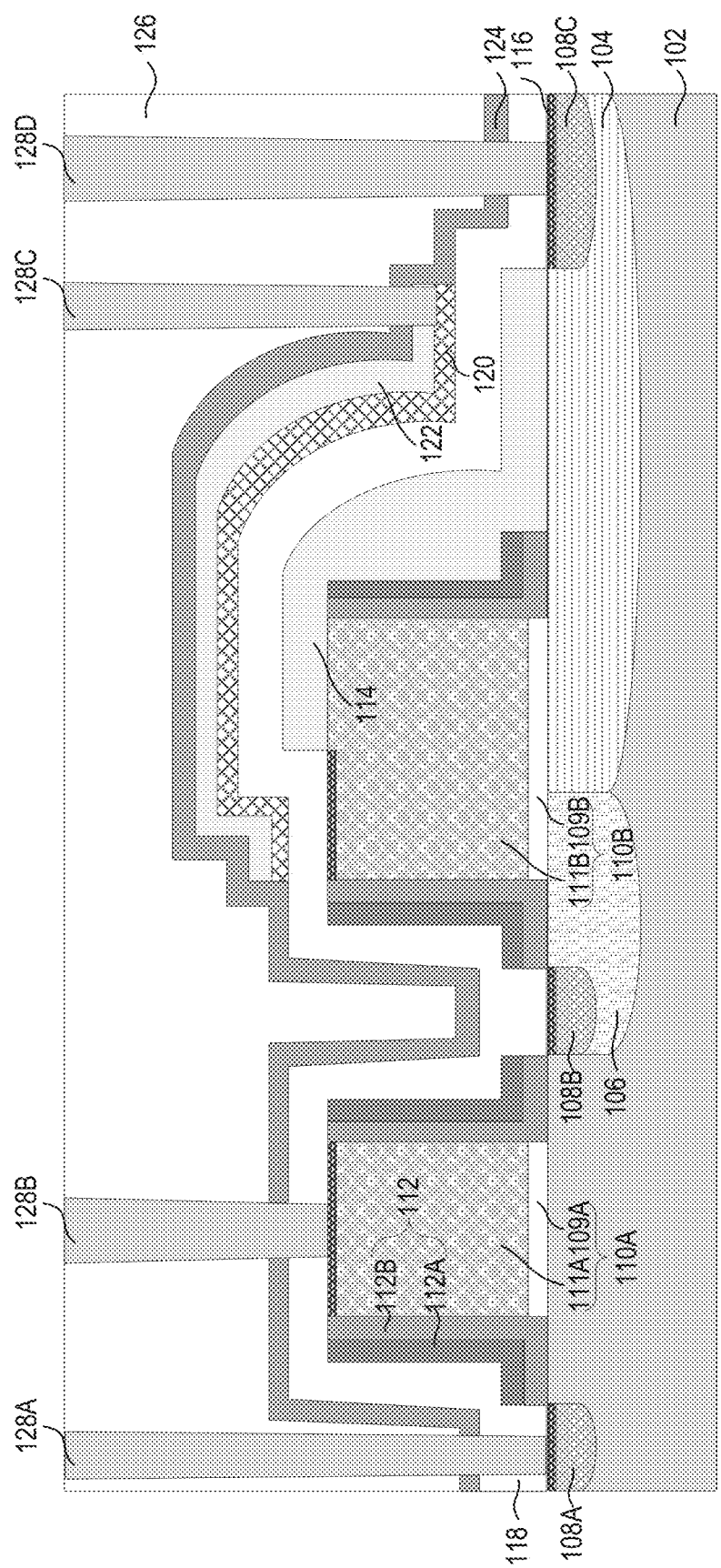

Referring to FIG. 4, in operation 430, a contact structure is formed in the ILD layer. For example, as shown in FIGS. 19A-19C, S/D contact structures 128A and 128D, gate contact structures 128B, and conductive plate contact structures 128C can be formed in ILD layer 126. FIG. 19A is the cross-sectional view of strained transistor 100A as shown in FIG. 1A at operation 430 in the fabrication process. FIG. 19B is the cross-sectional view of strained transistor 100B as shown in FIG. 1B at operation 430 in the fabrication process. FIG. 19C is the cross-sectional view of strained transistor 100C as shown in FIG. 1C at operation 430 in the fabrication process. Contact structure openings (not shown in FIGS. 19A-19C) can be formed in ILD layer 126 by a dry etch process or a wet etch process in a manner similar to that described with reference to FIG. 10 and operation 412 of FIG. 4. The areas for forming the contact structure openings can be defined by a photolithography process. In some embodiments, barrier layers (not shown in FIGS. 19A-19C) can be formed in the contact structure openings by a CVD process or an ALD process. S/D contact structures 128A and 128D, gate contact structures 128B, and conductive plate contact structures 128C can be formed in the contact structure openings by a sputtering process, an electroplating process, a PVD process, a CVD process, a plasma-enhanced chemical vapor deposition (PECVD) process, or a MOCVD process.

The present disclosure provides example strained LDMOSFETs (e.g., strained transistors 100A-100C) with an integrated conductive plate (e.g., conductive plate 120) and an example method (e.g., method 400) for fabricating the same. A first diffusion region (e.g., first diffusion region 106) and a second diffusion region (e.g., second diffusion region 104), longer than the first diffusion region, can be implanted in a substrate (e.g., substrate 102). Source/drain (S/D) regions (e.g., S/D regions 108A-108C) can be implanted in the substrate. Gate structures (e.g., gate structures 110A and 110B) and spacers (e.g., spacers 112) can be formed on the substrate. Silicide layers (e.g., silicide layers 116) can be formed on the S/D regions and portions of the gate structures. A protective layer (e.g., protective layer 114) can be formed on the second diffusion region and over a portion of the gate structures. A first insulating layer (e.g., first insulating layer 118) can be formed on the protective layer, on the S/D regions, on the silicide layers, over the gate structures, and over the spacers. A conductive plate can be formed on the first insulating layer. A first portion of the conductive plate can laterally extend over a horizontal portion of the protective layer. A second portion of the conductive plate can extend over a sidewall portion of the protective layer covering the sidewall of the gate structures. A third portion of the conductive plate can laterally extend over another horizontal portion of the protective layer above the top surface of the gate structures. A second insulating layer (e.g., second insulating layer 122) can be formed on the conductive plate. A first end of the second insulating layer can be substantially aligned with a first end of the conductive plate. A second end of the second insulating layer can be substantially aligned with a second end of the conductive plate. An etch stop layer (ESL) (e.g., ESL 124) can be formed on the first and second insulating layers. An ILD layer (e.g., ILD layer 126) can be formed on the ESL. Contact structures (e.g., S/D contact structures 128A and 128D, gate contact structures 128B, and conductive plate contact structures 128C) can be formed within the ILD layer.

The conductive plate can cause a RESURF electric field between the conductive plate and the second diffusion region. The RESURF electric field can generate a depletion region in the second diffusion region, which can increase the breakdown voltage of the LDMOSFETs. Because the conductive plate is below the ILD layer, the effect of the conductive plate in increasing the breakdown voltage is not affected by the ILD layer thickness. The conductive plate is separated from the second diffusion region by a distance controlled by the thicknesses of the protective layer and the first insulating layer. Compared with the ILD layer thickness, this distance is smaller, for example, between about 30 nm and about 100 nm in some embodiments. Therefore, the RESURF electric field strength can be increased and the effect of the conductive plate in increasing the breakdown voltage can be greater. The conductive plate can increase the breakdown voltage to meet a higher power/voltage level demand of the high-voltage power devices. The RESURF electric field strength and the breakdown voltage can be controlled by changing the thicknesses of the protective layer and the first insulating layer.

The conductive plate can also cause a compressive strain/stress in the drift region of the LDMOSFETs, and a compressive and/or a tensile strain/stress in the channel region of the LDMOSFETs. For example, in some embodiments, the conductive plate can cause between about 0.1 GPa and about 3 GPa compressive and/or tensile stress in the drift region and the channel region. The strains and the stresses in the drift region and the channel region can increase carrier mobility, such as electron mobility and hole mobility. The increased carrier mobility can decrease the channel region resistance and the drift region resistance, which can contribute to a decreased on-resistance. The decreased on-resistance can reduce power loss and improve power conversion efficiency. Furthermore, the conductive plate that increases the breakdown voltage and reduces the on-resistance is integrated into the fabrication of the LDMOSFETs. The integration can reduce the fabrication complexity, cycle time of fabricating high-voltage transistors, and cost.

In some embodiments, a structure includes a gate structure disposed on a diffusion region of a substrate, a protective layer in contact with the diffusion region and covering a sidewall of the gate structure and a portion of a top surface of the gate structure, and a first insulating layer in contact with the gate structure and the protective layer. The structure further includes a conductive plate in contact with the first insulating layer, where a first portion of the conductive plate laterally extends over a horizontal portion of the protective layer, and where a second portion of the conductive plate extends over a sidewall portion of the protective layer covering the sidewall of the gate structure. The structure further includes a second insulating layer in contact with the conductive plate.

In some embodiments, a structure includes a transistor structure, where the transistor structure includes a first diffusion region including a first source/drain (S/D) region, a second diffusion region longer than the first diffusion region and including a second S/D region, a gate structure disposed on the first and second diffusion regions, and a spacer disposed on the gate structure. The structure further includes a first oxide layer in contact with the second diffusion region and covering the spacer and a portion of a top surface of the gate structure and a second oxide layer in contact with the first and second S/D regions, the gate structure, and the first oxide layer. The structure further includes a metal layer in contact with the second oxide layer, where a first portion of the metal layer laterally extends over a horizontal portion of the first oxide layer, and where a second portion of the metal layer extends over a sidewall portion of the first oxide layer covering the spacer.

In some embodiments, a method includes forming a gate structure on a diffusion region of a substrate, forming a spacer on the gate structure, and forming a protective layer in contact with the diffusion region and covering the spacer and a portion of a top surface of the gate structure. The method further includes depositing a first insulating layer in contact with the gate structure and the protective layer and forming a conductive plate in contact with the first insulating layer, where a first portion of the conductive plate laterally extends over a horizontal portion of the protective layer, and where a second portion of the conductive plate extends over a sidewall portion of the protective layer covering the spacer. The method further includes forming a second insulating layer in contact with the conductive plate.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
    a gate structure disposed on a diffusion region of a substrate;
    a protective layer in contact with the diffusion region and covering a sidewall of the gate structure and a portion of a top surface of the gate structure;
    a first insulating layer in contact with the gate structure and the protective layer;
    a conductive plate in contact with a curved surface of the first insulating layer and isolated from the protective layer, wherein a first portion of the conductive plate laterally extends over a horizontal portion of the protective layer, and wherein a second portion of the conductive plate extends over a sidewall portion of the protective layer covering the sidewall of the gate structure; and
    a second insulating layer in contact with the conductive plate.

2. The structure of claim 1, wherein the substrate comprises an other diffusion region below the gate structure and shorter than the diffusion region, wherein the diffusion region and the other diffusion region comprise a source/drain (S/D) region, wherein the diffusion region comprises a first dopant with a first concentration, wherein the other diffusion region comprises a second dopant, opposite to the first dopant, with a second concentration, and wherein the S/D region comprises the second dopant with a third concentration higher than the second concentration.

3. The structure of claim 1, wherein the diffusion region comprises a S/D region comprising a first silicide layer, and wherein the gate structure comprises a second silicide layer, further comprising:
    a spacer interposed between the gate structure and the protective layer;
    a conductive plate contact structure in contact with the conductive plate;
    a S/D contact structure in contact with the first silicide layer; and
    a gate contact structure in contact with the second silicide layer.

4. The structure of claim 1, wherein a third portion of the conductive plate laterally extends over an other horizontal portion of the protective layer above the portion of the top surface of the gate structure.

5. The structure of claim 1, wherein the conductive plate is separated from the diffusion region by a distance between about 30 nm and about 100 nm.

6. The structure of claim 1, wherein the conductive plate comprises titanium nitride (TiN), tantalum nitride (TaN), titanium (Ti), tantalum (Ta), tungsten (W), cobalt (Co), copper (Cu), and combinations thereof.

7. The structure of claim 1, wherein the conductive plate has a thickness between about 10 nm and about 50 nm.

8. The structure of claim 1, wherein the second portion of the conductive plate comprises a concave sidewall in contact with the curved surface of the first insulating layer.

9. The structure of claim 1, wherein a first end of the second insulating layer is substantially aligned with a first end of the conductive plate, and wherein a second end of the second insulating layer is substantially aligned with a second end of the conductive plate.

10. The structure of claim 1, wherein the second insulating layer comprises a curved sidewall covering the second portion of the conductive plate.

11. A structure, comprising:
    a transistor structure comprising:
        a first diffusion region comprising a first source/drain (S/D) region;
        a second diffusion region longer than the first diffusion region and comprising a second S/D region;

a gate structure disposed on the first and second diffusion regions; and
a spacer disposed on the gate structure;
a first oxide layer in contact with the second diffusion region and covering the spacer and a portion of a top surface of the gate structure;
a second oxide layer extending continuously over the first and second S/D regions, the gate structure, and the first oxide layer; and
a metal layer in contact with the second oxide layer, wherein a first portion of the metal layer laterally extends over a horizontal portion of the first oxide layer, and wherein a second portion of the metal layer extends over a sidewall portion of the first oxide layer covering the spacer.

12. The structure of claim 11, wherein the first diffusion region comprises a first dopant with a first concentration, wherein the second diffusion region comprises a second dopant, opposite to the first dopant, with a second concentration, and wherein the first and second S/D regions comprise the second dopant with a third concentration higher than the second concentration.

13. The structure of claim 11, wherein the metal layer is separated from the second diffusion region by a distance between about 30 nm and about 100 nm, and wherein the metal layer has a thickness between about 10 nm and about 50 nm.

14. The structure of claim 11, wherein the metal layer comprises titanium nitride (TIN), tantalum nitride (TaN), titanium (Ti), tantalum (Ta), tungsten (W), cobalt (Co), copper (Cu), and combinations thereof.

15. The structure of claim 11, wherein a third portion of the metal layer laterally extends over an other horizontal portion of the first oxide layer above the portion of the top surface of the gate structure, and wherein the second portion of the metal layer comprises a curved sidewall covering a curved portion of the second oxide layer.

16. The structure of claim 11, wherein the gate structure and the first and second S/D regions comprise a silicide layer, further comprising:
a third oxide layer in contact with the metal layer, wherein a first end of the third oxide layer is substantially aligned with a first end of the metal layer, and wherein a second end of the third oxide layer is substantially aligned with a second end of the metal layer;
an etch stop layer (ESL) in contact with the second and third oxide layers;
an interlayer dielectric (ILD) layer disposed on the ESL; and
contact structures in contact with the metal layer and the silicide layer.

17. A method, comprising:
forming a gate structure on a diffusion region of a substrate;
forming a spacer on the gate structure;
forming a protective layer in contact with the diffusion region and covering the spacer and a portion of a top surface of the gate structure;
depositing a first insulating layer in contact with the gate structure and the protective layer;
forming a conductive plate in contact with a convex surface of the first insulating layer, wherein a first portion of the conductive plate laterally extends over a horizontal portion of the protective layer, and wherein a second portion of the conductive plate extends over a sidewall portion of the protective layer covering the spacer; and
forming a second insulating layer in contact with the conductive plate.

18. The method of claim 17, wherein forming the conductive plate comprises:
depositing a metal layer comprising titanium nitride (TiN), tantalum nitride (TaN), titanium (Ti), tantalum (Ta), tungsten (W), cobalt (Co), copper (Cu), and combinations thereof on the first insulating layer; and
removing a portion of the metal layer.

19. The method of claim 17, wherein forming the protective layer and depositing the first insulating layer comprise forming the protective layer and the first insulating layer with a combined thickness between about 30 nm and about 100 nm.

20. The method of claim 17, further comprising:
depositing an etch stop layer (ESL) on the first and second insulating layers;
forming an interlayer dielectric (ILD) layer on the ESL; and
forming a conductive plate contact structure through the ILD layer, the ESL, the second insulating layer, and in contact with the conductive plate.

* * * * *

UNITED STATES PATENT AND TRADEMARK OFFICE
CERTIFICATE OF CORRECTION

PATENT NO. : 12,166,108 B2
APPLICATION NO. : 17/747104
DATED : December 10, 2024
INVENTOR(S) : Hung et al.

Page 1 of 1

It is certified that error appears in the above-identified patent and that said Letters Patent is hereby corrected as shown below:

In the Claims

In Column 17, Claim 14, Line 29, delete "(TIN)," and insert -- (TiN), --, therefor.

Signed and Sealed this
Thirteenth Day of May, 2025

Coke Morgan Stewart
*Acting Director of the United States Patent and Trademark Office*